(12) United States Patent
Good et al.

(10) Patent No.: US 11,551,926 B2
(45) Date of Patent: Jan. 10, 2023

(54) METHODS OF FORMING A MICROELECTRONIC DEVICE, AND RELATED SYSTEMS AND ADDITIONAL METHODS

(71) Applicant: Micron Technology, Inc., Boise, ID (US)

(72) Inventors: Farrell M. Good, Meridian, ID (US); Robert K. Grubbs, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 17/248,376

(22) Filed: Jan. 22, 2021

(65) Prior Publication Data
US 2022/0238324 A1 Jul. 28, 2022

(51) Int. Cl.
| | | |
|---|---|---|
| *H01L 21/02* | (2006.01) | |
| *C23C 16/34* | (2006.01) | |
| *C23C 16/455* | (2006.01) | |
| *C23C 16/50* | (2006.01) | |
| *C23C 16/448* | (2006.01) | |

(52) U.S. Cl.
CPC ........ *H01L 21/0228* (2013.01); *C23C 16/345* (2013.01); *C23C 16/4481* (2013.01); *C23C 16/45542* (2013.01); *C23C 16/45548* (2013.01); *C23C 16/45553* (2013.01); *C23C 16/50* (2013.01); *H01L 21/0217* (2013.01); *H01L 21/02219* (2013.01); *H01L 21/02274* (2013.01)

(58) Field of Classification Search
None
See application file for complete search history.

(56) References Cited

U.S. PATENT DOCUMENTS

| | | |
|---|---|---|
| 9,355,837 B2 | 5/2016 | Marsh |
| 10,147,875 B1 | 12/2018 | Hansen et al. |
| 10,319,583 B2 | 6/2019 | Li et al. |
| 10,410,857 B2 | 9/2019 | Suzuki et al. |
| 2004/0025787 A1 | 2/2004 | Selbrede et al. |

(Continued)

FOREIGN PATENT DOCUMENTS

| | | |
|---|---|---|
| WO | 2002/065508 A2 | 8/2002 |
| WO | 2013/133942 A1 | 9/2013 |
| WO | 2017/023693 A1 | 2/2017 |

OTHER PUBLICATIONS

International Search Report for Application No. PCT/US2021/062665, dated Apr. 20, 2022, 5 pages.

(Continued)

*Primary Examiner* — Asok K Sarkar
(74) *Attorney, Agent, or Firm* — TraskBritt

(57) ABSTRACT

A method of forming a microelectronic device comprises treating a base structure with a first precursor to adsorb the first precursor to a surface of the base structure and form a first material. The first precursor comprises a hydrazine-based compound including Si—N—Si bonds. The first material is treated with a second precursor to covert the first material into a second material. The second precursor comprises a Si-centered radical. The second material is treaded with a third precursor to covert the second material into a third material comprising Si and N. The third precursor comprises an N-centered radical. An ALD system and a method of forming a seal material through ALD are also described.

27 Claims, 5 Drawing Sheets

(56) References Cited

U.S. PATENT DOCUMENTS

| | | | |
|---|---|---|---|
| 2006/0258173 A1 | 11/2006 | Xiao et al. | |
| 2011/0256734 A1 | 10/2011 | Hausmann et al. | |
| 2014/0273527 A1 | 9/2014 | Haukka et al. | |
| 2014/0273528 A1 | 9/2014 | Niskanen et al. | |
| 2014/0273530 A1 | 9/2014 | Nguyen et al. | |
| 2015/0099375 A1 | 4/2015 | Haripin et al. | |
| 2015/0147484 A1* | 5/2015 | Nguyen | C23C 16/45536 |
| | | | 427/535 |
| 2015/0200110 A1 | 7/2015 | Li et al. | |
| 2016/0068953 A1 | 3/2016 | Li et al. | |
| 2017/0114476 A1* | 4/2017 | Asmussen | C23C 16/4585 |
| 2017/0186603 A1 | 6/2017 | Moon et al. | |
| 2017/0301639 A1* | 10/2017 | Hiatt | H01L 25/50 |
| 2018/0218898 A1* | 8/2018 | Hirose | C23C 16/45553 |
| 2019/0088474 A1 | 3/2019 | MacDonald et al. | |
| 2019/0157057 A1 | 5/2019 | Stewart | |
| 2021/0175075 A1* | 6/2021 | Sharma | H01J 37/32577 |
| 2021/0305043 A1* | 9/2021 | Nakatani | C23C 16/04 |

OTHER PUBLICATIONS

Written Opinion of the International Searching Authority for Application No. PCT/US2021/062665, dated Apr. 21, 2022, 4 pages.

* cited by examiner

US 11,551,926 B2

METHODS OF FORMING A MICROELECTRONIC DEVICE, AND RELATED SYSTEMS AND ADDITIONAL METHODS

TECHNICAL FIELD

The disclosure, in various embodiments, relates generally to the field of microelectronic device design and fabrication. More specifically, the disclosure relates to methods of forming a microelectronic device, and to related atomic layer deposition (ALD) systems and methods of forming a seal material through ALD.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

Reducing the dimensions and spacing of features has placed increasing demands on the methods used to form the microelectronic devices. One solution has been to form three-dimensional (3D) microelectronic devices, such as 3D memory devices, in which the features are arranged vertically rather than horizontally. To form the features, multiple materials are positioned over one another and are etched to form stacks of the materials. For some memory devices (e.g., 3D cross-point memory devices), the materials include chalcogenide materials and electrode materials. Some of the materials of the stacks are sensitive to subsequently conducted process acts, such as to processing temperatures and/or etching conditions of the subsequent process acts. The materials of the stacks may, for example, be thermally sensitive and/or sensitive to etch chemistries.

To protect the materials of the stacks, a seal material including silicon nitride (SiN) has been formed on or over the stacks. Such a seal material is conventionally formed using one or more of a plasma-enhanced chemical vapor deposition (PECVD) process and a plasma-enhanced atomic layer deposition (PEALD) process. However, conventional PECVD processes for high aspect ratio structures and conventional PEALD processes can result in one or more of relatively slow rate of seal material formation (e.g., for PEALD, less than or equal to 0.5 Angstrom of seal material per deposition cycle); undesirable damage to sensitive materials due to exposure to plasma having relatively high ion energy density (IEDF) and/or due to exposure to relatively high processing temperatures; undesirable material modifications (e.g., contaminations) resulting from undesired, thermodynamically favored reactions with halide-containing reactant chemistries; and incomplete or non-uniform seal material coverage.

DETAILED DESCRIPTION

Figure 1:
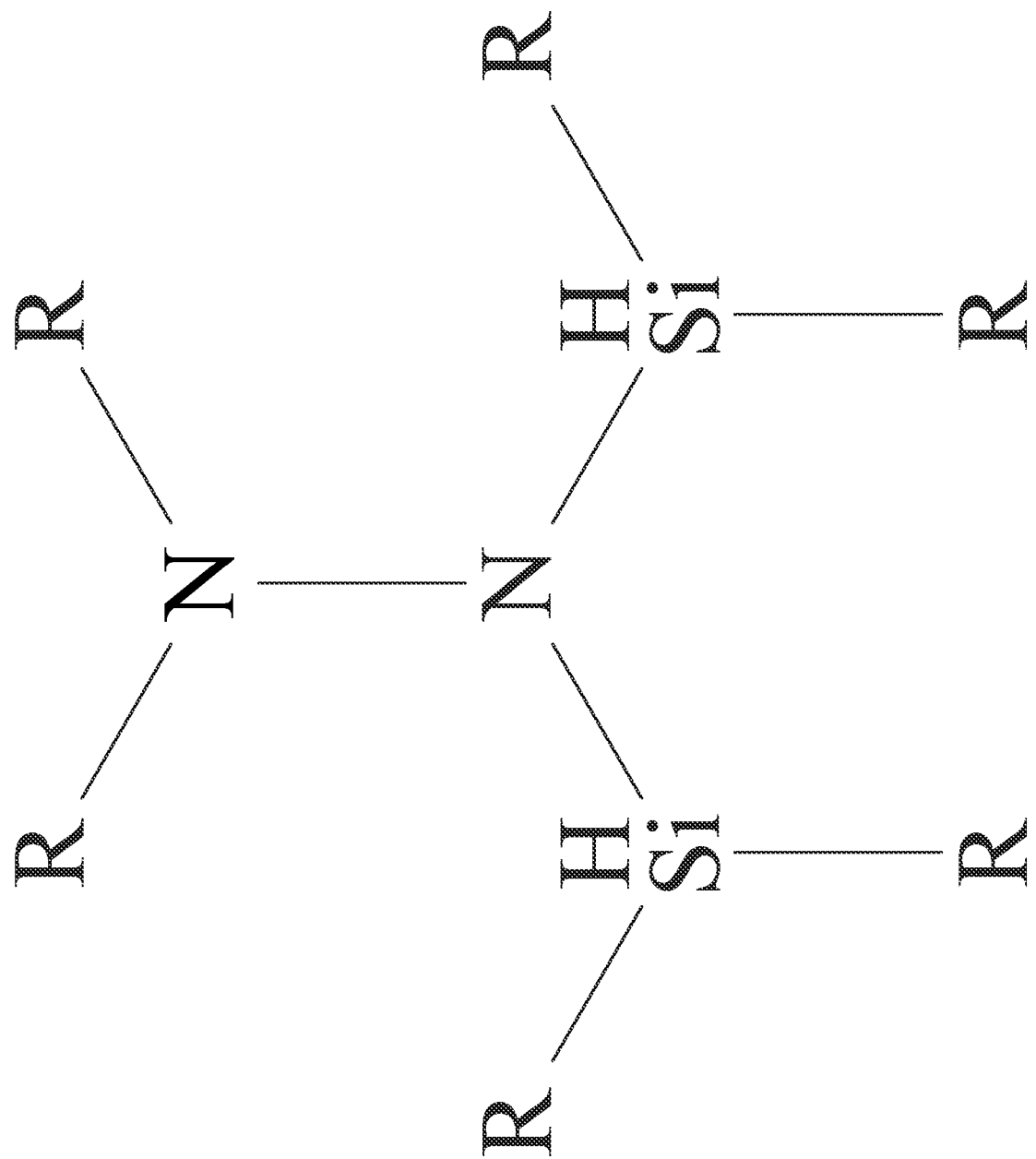
FIG. 1 shows the general structure of a hydrazine-based compound for use as a first precursor in an ALD process, in accordance with an embodiment of the disclosure.

The following description provides specific details, such as material compositions and processing conditions (e.g., temperatures) in order to provide a thorough description of embodiments of the disclosure. However, a person of ordinary skill in the art will understand that the embodiments of the disclosure may be practiced without necessarily employing these specific details. Indeed, the embodiments of the disclosure may be practiced in conjunction with conventional systems and methods employed in the industry. In addition, only those process components and acts necessary to understand the embodiments of the present disclosure are described in detail below. A person of ordinary skill in the art will understand that some process components (e.g., pipelines, line filters, valves, temperature detectors, flow detectors, pressure detectors, and the like) are inherently disclosed herein and that adding various conventional process components and acts would be in accord with the disclosure. Moreover, the description provided below does not form a complete process flow for manufacturing a microelectronic device. The structures described below do not form a complete microelectronic device. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate e.g., vertically closest to) one another. Moreover, features described as "horizontally neighboring" one another means and includes features of the disclosed identity (or identities) that are located most horizontally proximate (e.g., horizontally closest to) one another.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

In accordance with embodiments of the disclosure, a method of forming a microelectronic device (e.g., a memory device) includes forming a seal material on or over at least one addition material (e.g., a stack of materials) by way of an atomic layer deposition (ALD) process (e.g., a so-called "spatial" ALD process, a so-called "time-divided" ALD process). The seal material may at least partially encapsulate the additional material. For example, the seal material may substantially surround and cover upper surfaces (e.g., top surfaces) and side surfaces (e.g., sidewalls) of the additional material. The ALD process may relatively require less plasma exposure to form the seal material as compared to conventional processes (e.g., conventional PEALD processes, conventional PECVD processes) that have been employed to form the seal material. In addition, the ALD process may alleviate many undesirable reactions (e.g., thermodynamically favored reactions, reactions effectuated by halide-containing reactant chemistries) that may otherwise occur during conventional processes of forming a seal material that may contribute to undesirable deviations from (e.g., impurities within) a desired material composition of the seal material. The ALD process may also be conducted at relatively lower temperatures (e.g., temperatures within a range of from about 200° C. to about 550° C.) as compared to conventional processes of forming a seal material.

The additional material upon which a seal material of the disclosure is formed using systems, apparatuses, and methods of the disclosure may have a desired material composition. In some embodiments, the additional material comprises a chalcogenide material. The chalcogenide material may comprise one or more of a chalcogenide glass, a chalcogenide-metal ion glass, and another chalcogenide-containing material. The chalcogenide material may be a binary or multinary (e.g., ternary, quaternary) compound including at least one chalcogenide atom and at least one more electropositive element. As used herein, the term "chalcogenide" means and includes an element of Group VI of the Periodic Table, such as oxygen (O), sulfur (S), selenium (Se), or tellurium (Te). The electropositive element may include, but is not necessarily limited to, one or more of nitrogen (N), silicon (Si), nickel (Ni), gallium (Ga), germanium (Ge), arsenic (As), silver (Ag), indium (In), tin (Sn), antimony (Sb), gold (Au), lead (Pb), and bismuth (Bi). By way of example only, the chalcogenide material may include a compound including Ge, Sb, and Te (i.e., a GST compound), such as $Ge_2Sb_2Te_5$, however, the disclosure is not so limited and the chalcogenide material may include other compounds including at least one chalcogenide element. The chalcogenide material may be doped or undoped and may have metal ions mixed therein. By way of example only, the chalcogenide material may be an alloy including indium, selenium, tellurium, antimony, arsenic, bismuth, germanium, oxygen, tin, or combinations thereof. In additional embodiments, the additional material may comprise one or more of an electrically insulative material, an electrically conductive material, and a semiconductor material. The additional material may be heterogeneous, or additional material may be substantially homogeneous.

The seal material formed through the methods of the disclosure may comprise a silicon-containing material configured and formulated to protect the additional material (e.g., chalcogenide material) thereunder during and/or after subsequent processing to form a microelectronic device of the disclosure. The seal material may, for example, be configured and formulated to provide a hermetic barrier that inhibits (e.g., prevents) water from passing through the seal material and into the additional material. The seal material may also configured and formulated to protect the additional material from undesirable oxidation and/or damage during subsequent processing acts that may otherwise occur if the seal material was not formed. In addition, the seal material may substantially confine (e.g., contain) the chalcogenide material to a specific (e.g., local) region to maintain a desirable physical condition and stoichiometry thereof. In some embodiments, the seal material is formed to include silicon (Si) and nitrogen (N). By way of non-limiting example, the seal material may be formed to comprise one or more of a silicon nitride material (e.g., $SiN_x$), a silicon oxynitride material (e.g., $SiO_yN_x$), and a silicon carboxynitride material ($SiO_xC_zN_y$). Formulae including one or more of "x", "y", and "z" herein (e.g., $SiN_y$, $SiO_xN_y$, $SiO_yC_zN_x$) represent a material that contains an average ratio of "x" atoms of one element, "y" atoms of another element (if any), and "z" atoms of an additional element (if any) for every one atom of another element (e.g., Si). As the formulae are representative of relative atomic ratios and not strict chemical structure, an insulative material may comprise one or more stoichiometric compounds and/or one or more non-stoichiometric compounds, and values of "x", "y" (if any), and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

The ALD process utilized to form the seal material includes a plurality of deposition cycles conducted within an ALD apparatus (e.g., a spatial ALD apparatus, a time-divided ALD apparatus) of the disclosure. At least one (e.g., at least some) of the deposition cycles includes a treatment sequence (e.g., material exposure sequence) including a first precursor, a second precursor, and a third precursor. The first precursor comprises a first chemical species including silicon and nitrogen. The second precursor comprises second chemical species different than the first chemical species and including silicon. The third precursor comprises third chemical species different than each of the first chemical species and the second chemical species and including nitrogen. At least two (2) (e.g., each) of the first precursor, the second precursor, and the third precursor may be introduced sequentially (e.g., in time and/or space) relative to one another. For example, each of the second precursor and a third precursor may be introduced (e.g., sequentially introduced, simultaneously introduced) after the first precursor within at the deposition cycle of the ALD process. The first precursor may chemisorb to at least one surface of at least one additional material (e.g., at least one chalcogenide material), and then second precursor and the third precursor may be introduced (e.g., sequentially introduced, simultaneously introduced) to and reacted with the chemisorbed first precursor and/or a chemisorbed material comprising a reaction product of the chemisorbed first precursor and one of the second precursor and the third precursor. As used herein, the terms "chemisorb" and "chemisorption" mean and include a mechanism wherein at least one precursor is adsorbed or bound to at least one surface of a material by way of chemical bonding, such as one or more of covalent bonding and ionic bonding. The treatment sequence of the deposition cycle may also include the introduction of at least one other material (e.g., an inert gas, $N_2$ gas, plasma), following the introduction of at least one (e.g., each) of the first precursor, the second precursor, and the third precursor. The first precursor, the second precursor, the third precursor, the other material, and potential sequences thereof in one or more deposition cycles of the ALD process are described in further detail below.

The first precursor may comprise a compound including silicon bonded to nitrogen (e.g., at least one Si—N bond, such as at least one Si—N single bond) that is able to chemisorb to the additional material (e.g., chalcogenide material) upon which the seal material is to be formed. The compound may also include nitrogen bonded to nitrogen (e.g., at least one N—N bond, such as at least one N—N single bond). In some embodiments, the first precursor comprises a hydrazine-based compound including Si—N—Si bonds. By way of non-limiting example, the first precursor may comprise a compound having the general structure shown in FIG. 1, wherein each R group is individually hydrogen; a substituted or unsubstituted alkyl group (e.g., linear, branched, or cyclic) containing from one (1) carbon atom to ten (10) carbon atoms; or a substituted or unsubstituted aryl group or heteroaryl group. Each R group may individually be selected so that the first precursor exhibits desired properties (e.g., reactivity, volatility, toxicity) for use in the ALD process. In some embodiments, at least one (e.g., each) R group is a methyl group. As a non-limiting example, the first precursor may comprise 1,2-Bis(trimethylsilyl)hydrazine ($C_6H_{20}N_2Si_2$). The first precursor may be free of (e.g., may not include) any halogens (e.g., fluorine (F), chlorine (Cl), bromine (Br), iodine (I)).

The first precursor is reactive with uncoordinated sites of the additional material (e.g., chalcogenide material) upon which the seal material is to be formed through the ALD process of the disclosure, and is also reactive with the second precursor and the third precursor employed in the ALD process. For example, if the first precursor is a hydrazine-based compound having the general structure shown in FIG. 1, the N—N bonds, the Si—N bonds, and/or the Si—R bonds thereof may readily be broken at relatively low temperatures (e.g., temperatures less than or equal to 550° C., such as within a range of from about 200° C. to about 550° C.) to form radicals (e.g., N-centered radicals, Si-centered radicals) that individually readily react with the uncoordinated sites of the material(s), the second precursor, or the third precursor. The first precursor may have a superior sticking coefficient and enhanced reactivity (at least at relatively low temperatures) as compared to conventional precursors employed in conventional processes of forming a desired seal material (e.g., $SiN_x$, $SiO_yN_x$, $SiO_yC_zN_x$) on an additional material (e.g., a chalcogenide material). For example, N—$NR_2$ bonding characteristics of the hydrazine-based compound shown in FIG. 1 may facilitate faster reactivity and enhanced sticking coefficient as compared to the Si—$NR_2$ bonding characteristics of many conventional precursors for the formation of the desired seal material. In addition, the absence of Si—Si bonds in the hydrazine-based compound shown in FIG. 1 may alleviate the need to employ plasma (e.g., N-containing plasma) to form the desired seal material. Furthermore, the absence of halogens within the first precursor may avoid undesirable reactions that may otherwise interfere with the efficiency of ALD process and/or a desired material composition of the seal material and/or the additional material (e.g., chalcogenide material) thereunder.

The first precursor may be in a solid state, a liquid state, or a gaseous state at room temperature and atmospheric pressure. In some embodiments, the first precursor is in a liquid state (e.g., a liquid form) at room temperature and atmospheric pressure. If the first precursor is in a liquid state or a solid state at room temperature and atmospheric pressure, the first precursor may be vaporized before introduction to the additional material upon which the seal material is to be formed. Such vaporization of the first precursor is described in further detail below.

The second precursor may function as a source of at least silicon for the seal material. In some embodiments, the second precursor comprises a silicon-centered radical (also referred to as a "silyl radical"). The second precursor may, for example, be formed by processing (e.g., plasma processing) a silicon-containing compound, such as one or more of silane ($SiH_4$), disilane ($Si_2H_6$), a higher silane compound, a hydrozido family molecule (e.g., tetrasilyhydrazine ($H_{12}H_2Si_4$)), an organoaminosilane (e.g., bis(diethylamino) silane ($C_8H_{22}N_2Si$), a silicon tetrahalide (e.g., silicon tetraiodide ($SiI_4$), a disilicon hexahalide (e.g., hexachlorodisilane (($SiCl_3)_2$)), trisilyamine ($H_9NSi_3$), and a hydrohalosilane (e.g., diiodosilane ($H_2I_2Si$)). As described in further detail below, in some embodiments, the second precursor is formed using one or more of remote plasma excitation and direct plasma excitation of the silicon-containing compound. The silicon-containing compound may be in a solid state, a liquid state, or a gaseous state at room temperature and atmospheric pressure. If the silicon-containing compound is in a liquid state or a solid state at room temperature and atmospheric pressure, the silicon-containing compound may be vaporized before being processed to form the silicon-centered radical therefrom.

The third precursor may function as a source of at least nitrogen for the seal material. In some embodiments, the third precursor comprises a nitrogen-centered radical. The third precursor may, for example, be formed by processing (e.g., plasma processing) a nitrogen-containing molecule, such as one or more of molecular nitrogen ($N_2$) and ammonia ($NH_3$). As described in further detail below, in some embodiments, the third precursor is formed using one or more of remote plasma excitation and direct plasma excitation of the nitrogen-containing molecule.

The other material, if any, employed in one or more of the deposition cycles of the ALD process may function to purge at least one chamber of an ALD apparatus employed in the ALD process of one or more of the first precursor, the second precursor, the third precursor, unbound reaction products thereof, and other materials at one or more points in the one or more of the deposition cycles. In additional embodiments, the other material is employed to treat (e.g., plasma treat) one or more of the first precursor, the second precursor, the third precursor, and a seal material formed through other steps of an individual deposition cycle of the ALD process. By way of non-limiting example, the other material may comprise one or more of at least one inert gas (e.g. at least one noble gas), such as one or more of helium (He) gas, neon (Ne) gas, and argon (Ar) gas; nitrogen ($N_2$) gas; and a plasma (e.g., an N-containing plasma). In further embodiments, the other material may be omitted from the deposition cycles of the ALD process. By way of non-limiting example, negative pressure (e.g., a vacuum) may be employed to purge at least one chamber of an ALD apparatus used in the ALD process of one or more of the first precursor, the second precursor, the third precursor, unbound reaction products thereof, and other materials at one or more points in individual deposition cycles of the ALD process.

Figure 2:
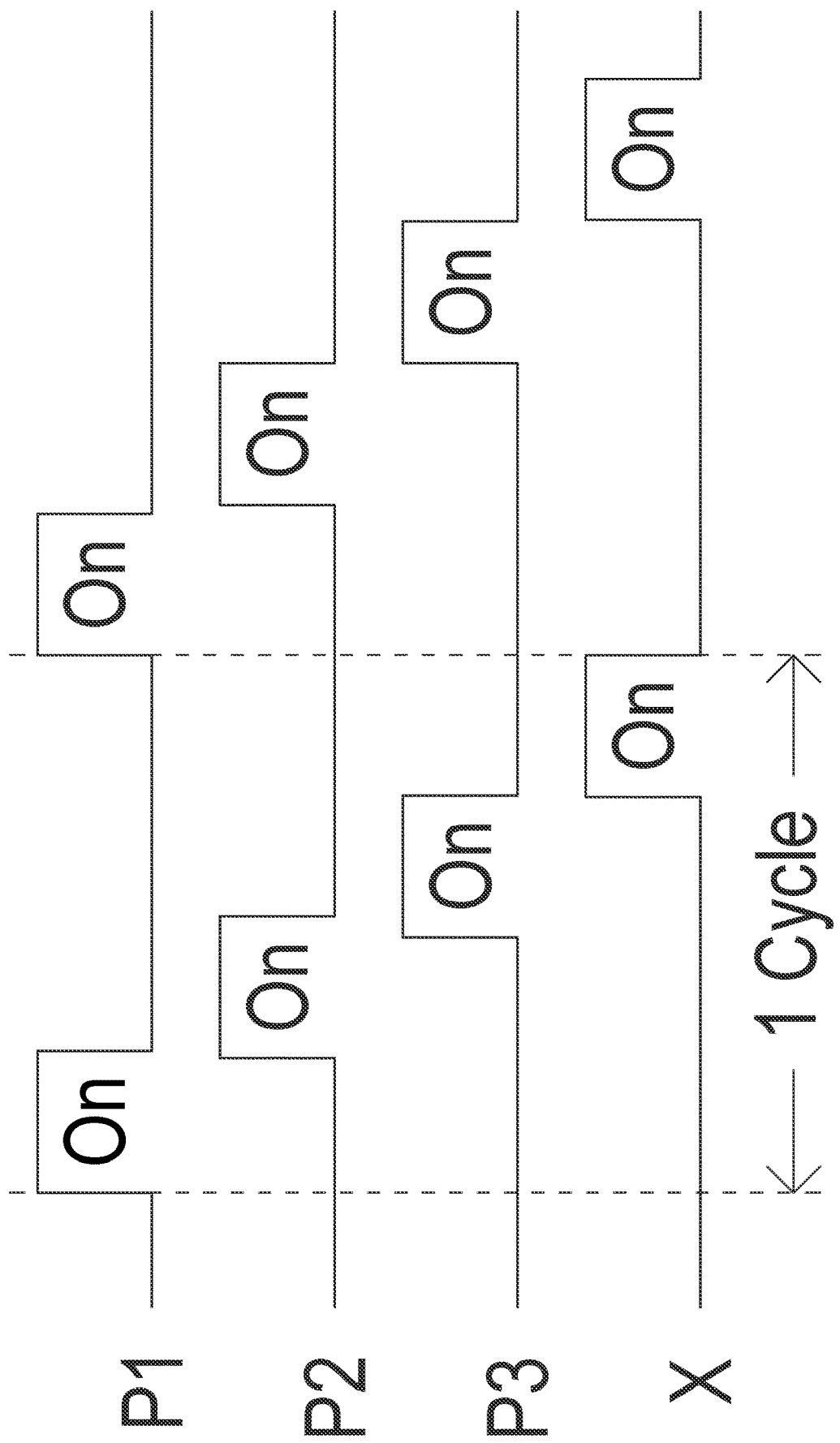
FIG. 2 shows a material exposure sequence of a deposition cycle of an ALD process, in accordance with an embodiment of the disclosure.

FIG. 2 shows a non-limiting example of a material exposure sequence of a deposition cycle of an ALD process to form a seal material of the disclosure. As shown in FIG. 2, an individual deposition cycle of the ALD process may include a first act (e.g., a first step, a first phase) including treatment with (e.g., exposure to) the first precursor P1; a second act (e.g., a second step, a second phase) initiated following the completion of the first act and including treatment with (e.g., exposure to) the second precursor P2; a third act (e.g., a third step, a third phase) initiated following the completion of the second act and including treatment with (e.g., exposure to) the third precursor P3; and a fourth act (e.g., a fourth step, a fourth phase) initiated following the completion of the third act and including treatment with (e.g., exposure to) the other material X. The first precursor P1, the second precursor P2, the third precursor P3, and the other material X shown in FIG. 2 respectively correspond to (e.g., are the same as) the first precursor, the second precursor, the third precursor, and the other material previously described herein (e.g., the first precursor P1 shown in FIG. 2 may be the first precursor previously described herein with reference to FIG. 1). The deposition cycle shown in FIG. 2 may be repeated a desired number of times to at least partially form a seal material having a desired thickness. The different acts (e.g., the first act, the second act, the third act, the fourth act) of the deposition cycle of the ALD process may be effectuated using spatial and/or time-divided approaches (e.g., using a spatial ALD process and associated spatial ALD apparatus, using a time-divided ALD process and associated time-divided ALD apparatus), as described in further detail below.

In some embodiments, the deposition cycle shown in FIG. 2 is performed one or more times to initiate (e.g., start) the formation of the seal material, and then one or more additional deposition cycles having different characteristics (e.g., employing different material exposure sequence(s) and/or different precursors) than the deposition cycle shown in FIG. 2 are employed to continue and complete the formation of the seal material. The deposition cycle shown in FIG. 2 may, for example, be employed to form a seed layer of the seal material on additional material(s) (e.g., chalcogenide material), and then the seed layer may be used to form an additional amount of the seal material (e.g., to increase a thickness of the seal material) over the additional material(s) using the additional deposition cycle(s). At least the first act of the deposition cycle shown in FIG. 2, including the treatment with the first precursor P1, may expedite the formation of the seal material to a desired thickness relative to conventional methods of forming a seal material using an ALD process due to favorable properties (e.g., sticking coefficient, reactivity) of the first precursor P1. In some embodiments, the first act of the deposition cycle facilitates the formation of greater than 0.5 Angstrom (Å) (e.g., greater than or equal to 0.75 Å, greater than or equal to 1.0 Å) of the seal material per deposition cycle. In contrast, a conventional deposition cycle of a conventional ALD process not including the first act (e.g., not including treatment with the first precursor P1) may only facilitate the formation of less than or equal to 0.5 Å of corresponding seal material per deposition cycle.

In additional embodiments, an ALD process employing at least one deposition cycle having a different material exposure sequence than that shown in FIG. 2, but still including a first act including treatment with the first precursor P1, is used to at least partially form a seal material of the disclosure. As non-limiting example, a deposition cycle in accordance with additional embodiments of the disclosure may include a first act including treatment with the first precursor P1; a second act initiated following the completion of the first act and including treatment with the third precursor P3; a third act initiated following the completion of the second act and including treatment with the second precursor P2; and a fourth act initiated following the completion of the third act and including treatment with the other material X. As an additional non-limiting example, a deposition cycle in accordance with additional embodiments of the disclosure may include multiple (e.g., more than one) sub-cycles of a first act including treatment with the first precursor P1 and a second act including treatment with the second precursor P2 prior to initiation of a third act including treatment with the third precursor P3. An initial first act may include a first treatment with the first precursor P1, an initial second act including a first treatment with the second precursor P2 may be effectuated after the initial first act, another first act including a second treatment with the first precursor P1 may be effectuated the initial second act, another second act including a second treatment with the second precursor P2 may be effectuated after completion of the another first act, and at least a third act including a treatment with the third precursor P3 may be effectuated after completion of the another second act. As a further non-limiting example, a deposition cycle in accordance with further embodiments of the disclosure may include a first act including treatment with the first precursor P1 followed by a second act including simultaneous (e.g., concurrent) treatment with the second precursor P2 and the third precursor P3.

Following the formation of at least a seed layer of the seal material using at least one deposition cycle (e.g., the deposition cycle shown in FIG. 2) including treatment with the first precursor (e.g., the first precursor previously described with reference to FIG. 1), the ALD process may, optionally, employ one or more additional deposition cycles not including an act (e.g., a first act) including treatment with the first precursor. For example, following the formation of at least a seed layer of the seal material using the deposition cycle previously described with reference to FIG. 2, the ALD process may include at least one additional deposition cycle in which the first act including treatment with the first precursor P1 is omitted. Instead, a first act of such an additional deposition cycle may include treatment with the second precursor P2 (or the third precursor P3), and a second act of such an additional deposition cycle may include treatment with the third precursor P3 (or the second precursor P2 if the third precursor P3 was used in the first act).

As previously discussed, in accordance with embodiments of the disclosure, ALD-based formation of the seal material may be effectuated using a spatial ALD process and associated spatial ALD apparatus, or may be effectuated using a time-divided ALD process and associated time-divided ALD apparatus. A spatial ALD system of the disclosure including a spatial ALD apparatus facilitating formation of the seal material by way of a spatial ALD process is described in further detail below with reference to FIGS. 3A and 3B. A time-divided ALD system of the disclosure including a time-divided ALD apparatus facilitating formation of the seal material by way of a time-divided ALD process is described in further detail below with reference to FIG. 4.

Figure 3A:
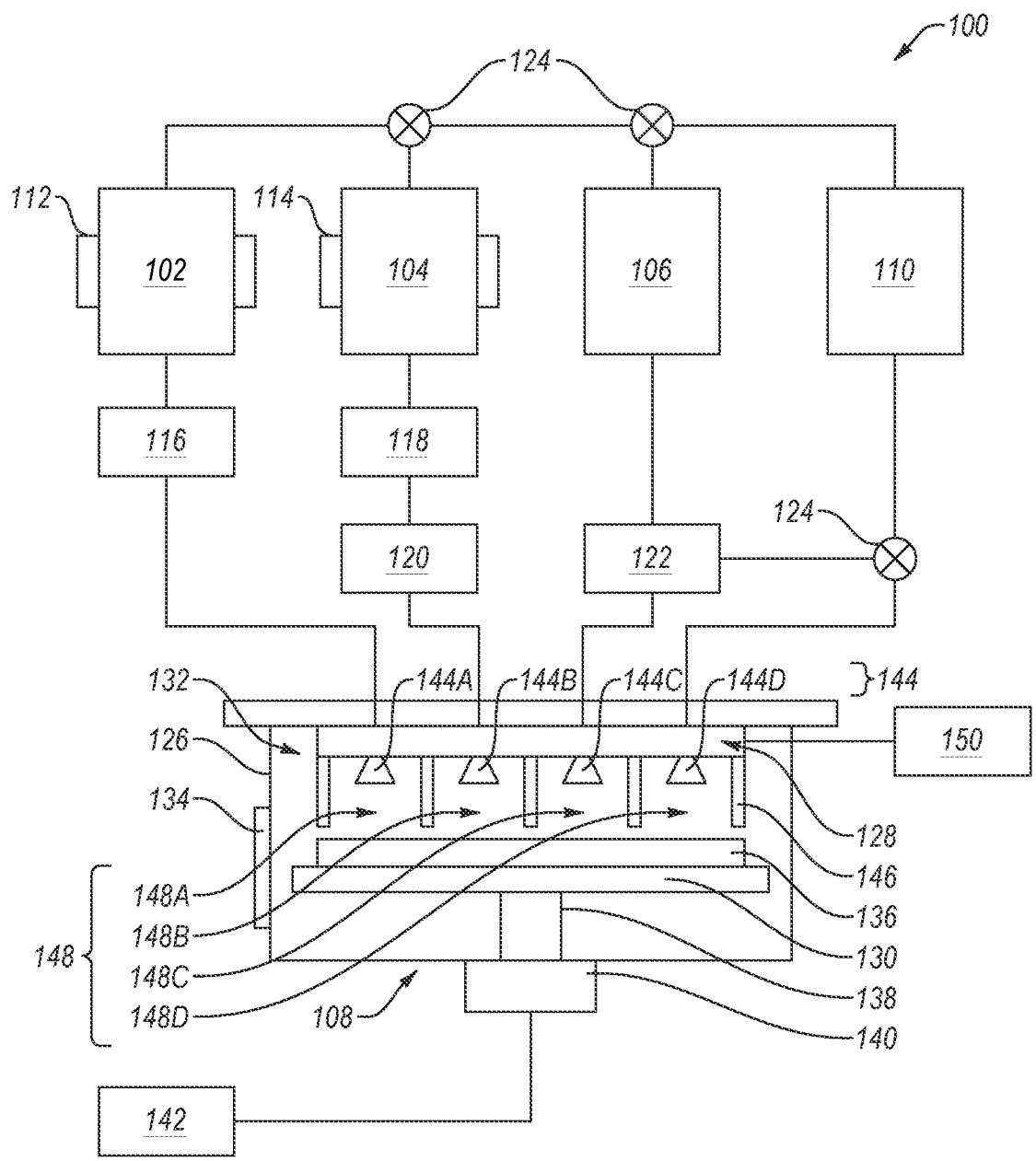
FIG. 3A is a simplified schematic view of a spatial ALD system, in accordance with an embodiment of the disclosure.

FIG. 3A is a simplified schematic view of a spatial ALD system 100, in accordance with an embodiment of the disclosure. The spatial ALD system 100 may be used to form a microelectronic device including a seal material of the disclosure through a spatial ALD process, as described in further detail below. As shown in FIG. 3A, the spatial ALD system 100 may include a first precursor source 102, a second precursor source 104, a third precursor source 106, and at least one spatial ALD apparatus 108. The spatial ALD apparatus 108 may be in selective (e.g., subject to operator or system control) fluid communication with each of the first precursor source 102, the second precursor source 104, and the third precursor source 106. The spatial ALD system 100 may further include additional apparatuses operatively associated with one or more of the first precursor source 102, the second precursor source 104, the third precursor source 106, and the spatial ALD apparatus 108, as described in further detail below.

The first precursor source 102 comprises at least one apparatus (e.g., containment vessel) configured and operated to contain (e.g., store) and/or produce the first precursor previously described therein (e.g., the hydrazine-based compound previously described with reference to FIG. 1). The first precursor may be contained within the first precursor source 102 in one or more of a gaseous state, a liquid state, and a flowable solid state. In some embodiments, the first precursor source 102 is configured and operated to contain first precursor in a liquid state.

The spatial ALD system 100 may include a single (i.e., only one) first precursor source 102, or may include multiple (i.e., more than one) first precursor sources 102. If the spatial ALD system 100 includes multiple first precursor sources 102, the first precursor sources 102 may be substantially similar to one another (e.g., may exhibit substantially similar components, component sizes, component shapes, component material compositions, component material distributions, component positions, component orientations) and may be operated under substantially similar conditions (e.g., substantially similar temperatures, pressures, flow rates), or at least one of the first precursor source 102 may be different (e.g., exhibit one or more of different components, different component sizes, different component shapes, different component material compositions, different component material distributions, different component positions, different component orientations) than at least one other of the first precursor sources 102 and/or may be operated under different conditions (e.g., different temperatures, different pressures, different flow rates, etc.) than at least one other of the first precursor sources 102. For example, the spatial ALD system 100 may include at least two (2) first precursor sources 102, wherein one of the first precursor sources 102 is configured to contain one first precursor, and another of the first precursor sources 102 is configured to contain another, different first precursor. In some embodiments, two or more first precursor sources 102 are provided in parallel with one another within the spatial ALD system 100. In additional embodiments, two or more first precursor sources 102 are provided in series with one another within the spatial ALD system 100.

The second precursor source 104 comprises at least one apparatus (e.g., containment vessel) configured and operated to contain (e.g., store) and/or produce a material employed to form the second precursor (e.g., silicon-centered radical) previously described herein. By way of non-limiting example, the second precursor source 104 may be configured and operated to contain a silicon-containing compound, such as one or more of $SiH_4$, $Si_2H_6$, a silicon tetrahalide (e.g., $SiI_4$), a disilicon hexahalide e.g., $(SiCl_3)_2$), $H_9NSi_3$, and a hydrohalosilane (e.g., $H_2I_2Si$). The material employed to form the second precursor may be contained within the second precursor source 104 in one or more of a gaseous state, a liquid state, and a flowable solid state. In some embodiments, the second precursor source 104 is configured and operated to contain the material employed to form the second precursor in a liquid state.

The spatial ALD system 100 may include a single (i.e., only one) second precursor source 104, or may include multiple (i.e., more than one) second precursor sources 104. If the spatial ALD system 100 includes multiple second precursor sources 104, the second precursor sources 104 may be substantially similar to one another and may be operated under substantially similar conditions, or at least one of the second precursor sources 104 may be different than at least one other of the second precursor sources 104 and/or may be operated under different conditions than at least one other of the second precursor sources 104. For example, the spatial ALD system 100 may include at least two (2) second precursor sources 104, wherein one of the second precursor sources 104 is configured to contain one material employed to form one second precursor, and another of the second precursor sources 104 is configured to contain another, different material employed to from another, different second precursor. In some embodiments, two or more second precursor sources 104 are provided in parallel with one another within the spatial ALD system 100. In additional embodiments, two or more second precursor sources 104 are provided in series with one another within the spatial ALD system 100.

The third precursor source 106 comprises at least one apparatus (e.g., containment vessel) configured and operated to contain (e.g., store) and/or produce a material employed to form the third precursor (e.g., nitrogen-centered radical) previously described herein. By way of non-limiting example, the third precursor source 106 may be configured and operated to contain a nitrogen-containing molecule, such as one or more of $N_2$ and $NH_3$. The material employed to form the third precursor may be contained within the third precursor source 106 in one or more of a gaseous state, a liquid state, and a flowable solid state. In some embodiments, the third precursor source 106 is configured and operated to contain the material employed to form the third precursor in a gaseous state.

The spatial ALD system 100 may include a single (i.e., only one) third precursor source 106, or may include multiple (i.e., more than one) third precursor sources 106. If the spatial ALD system 100 includes multiple third precursor sources 106, the third precursor sources 106 may be substantially similar to one another and may be operated under substantially similar conditions, or at least one of the third precursor sources 106 may be different than at least one other of the third precursor sources 106 and/or may be operated under different conditions than at least one other of the third precursor sources 106. For example, the spatial ALD system 100 may include at least two (2) third precursor sources 106, wherein one of the third precursor sources 106 is configured to contain one material employed to form one third precursor, and another of the third precursor sources 106 is configured to contain another, different material employed to from another, different third precursor. In some embodiments, two or more third precursor sources 106 are provided in parallel with one another within the spatial ALD system 100. In additional embodiments, two or more third precursor sources 106 are provided in series with one another within the spatial ALD system 100.

Still referring to FIG. 3A, the spatial ALD system 100 may also include at least one other material source 110 in selective (e.g., subject to operator or system control) fluid communication with one or more (e.g., each) of the first precursor source 102, the second precursor source 104, the third precursor source 106, and the spatial ALD apparatus 108. The other material source 110 comprises at least one apparatus (e.g., containment vessel) configured and operated to contain (e.g., store) and/or produce the other material (e.g., inert gas, nitrogen gas, nitrogen-containing plasma)

previously described herein. By way of non-limiting example, the other material source 110 may be configured and operated to contain inert gas, such as one or more of He gas, Ne gas, and Ar gas. The inert gas may for example, be employed as a carrier gas (e.g., for the first precursor within the first precursor source 102, for the material within the second precursor source 104) within the spatial ALD system 100, and/or to generate desired radicals (e.g., one or more Si-centered radicals, serving as the second precursor, from material within the second precursor source 104; one or more N-centered radicals, serving as the third precursor, from material within the third precursor source 106) within the spatial ALD system 100. The other material source 110 may, for example, be employed to generate plasma (e.g., remote from the spatial ALD apparatus 108, directly within the spatial ALD apparatus 108) that may at least be used to form the second precursor and the third precursor previously described herein from the materials contained within the second precursor source 104 and the third precursor source 106, respectively.

The spatial ALD system 100 may, optionally, further include one or more heating apparatuses (e.g., one or more of at least one heat exchanger, such as a tube-in-tube heat exchanger and/or a shell-and-tube heat exchanger; at least one combustion heater; at least one nuclear heater; at least one sonication heater; at least one electrical resistance heater; at least one inductive heater; at least one electromagnetic heater, such as an infrared heater and/or a microwave heater) operatively associated with one or more of the first precursor source 102, the second precursor source 104, the third precursor source 106, and the additional material source 110. By way of non-limiting example, as shown in FIG. 3A, the spatial ALD system 100 may include a first heating apparatus 112 operatively associated with the first precursor source 102, and a second heating apparatus 114 operatively associated with the second precursor source 104. The first heating apparatus 112 may be employed to heat or maintain the first precursor at a desired temperature within the first precursor source 102, such as a temperature facilitating flowability of the first precursor. The second heating apparatus 114 may be employed to heat or maintain the material employed to form the second precursor at a desired temperature within the second precursor source 104, such as a temperature facilitating flowability of the material employed to form the second precursor.

Still referring to FIG. 3A, the spatial ALD system 100 may, optionally, further include one or more vaporization apparatuses (e.g., one or more ampules) operatively associated with one or more of the first precursor source 102, the second precursor source 104, the third precursor source 106, and the other material source 110. By way of non-limiting example, if the first precursor source 102 and the second precursor source 104 are configured and operated to contain the materials held therein (e.g., the first precursor, a material to be employed to form the second precursor) in a liquid state, the spatial ALD system 100 may include a first vaporization apparatus 116 downstream of the first precursor source 102, and a second vaporization apparatus 118 downstream of the second precursor source 104. The first vaporization apparatus 116 may be configured and operated to receive a first fluid stream including a liquid form of the first precursor from the first precursor source 102, and to vaporize the liquid form of the first precursor to form a gaseous form of the first precursor that may then be directed toward the spatial ALD apparatus 108. The second vaporization apparatus 118 may be configured and operated to receive a second fluid stream including a liquid form of material to be used to form second precursor from the second precursor source 104, and to vaporize the liquid form of the material to form a gaseous form of the material that may then be directed toward the spatial ALD apparatus 108.

Optionally, the spatial ALD system 100 may further include one or more radical-generation apparatuses (e.g., remote plasma sources, laser energy sources, microwave energy sources) operatively associated with one or more of the first precursor source 102, the second precursor source 104, the third precursor source 106, and the other material source 110. By way of non-limiting example, the spatial ALD system 100 may include a first radical-generation apparatus 120 downstream of the second precursor source 104 (and the second vaporization apparatus 118, if any), and a second radical-generation apparatus 122 downstream of the third precursor source 106. In some embodiments, one or more of the first radical-generation apparatus 120 and the second radical-generation apparatus 122 are also downstream of the other material source 110. The first radical-generation apparatus 120 may be configured and operated to receive a gaseous form of the material (e.g., Si-containing compound) contained in the second precursor source 104 (e.g., from the second vaporization apparatus 118) and to generate the second precursor (e.g., Si-centered radical) previously described herein therefrom. The second precursor may then be directed toward the spatial ALD apparatus 108. The second radical-generation apparatus 122 may be configured and operated to receive a gaseous form of the material (e.g., N-containing molecule) contained in the third precursor source 106 and to generate the third precursor (e.g., N-centered radical) previously described herein therefrom. The third precursor may then be directed toward the spatial ALD apparatus 108. In additional embodiments, such as embodiments where one or more (e.g., each) of the second precursor and the third precursor are formed within the spatial ALD apparatus 108 (e.g., as opposed to remote from the spatial ALD apparatus 108), one or more of the first radical-generation apparatus 120 and the second radical-generation apparatus 122 are omitted (e.g., absent) from the spatial ALD system 100.

As shown in FIG. 3A, the spatial ALD system 100 may further include various valves 124 operatively associated with one or more of the first precursor source 102, the second precursor source 104, the third precursor source 106, and the other material source 110. Some of the valves 124 may, for example, be configured and positioned to selectively (e.g., subject to operator or system control) establish (and, as desired, terminate) fluid communication between the other material source 110 and one or more of the first precursor source 102, the second precursor source 104, the third precursor source 106, the first radical-generation apparatus 120 (if any), the second radical-generation apparatus 122 (if any), and the spatial ALD apparatus 108. For clarity and ease of understanding the drawings and associated description, not all potential valve (and, hence, piping) configurations and positions that may be utilized to selectively establish (and, as desired, terminate) fluid communication between the other material source 110 and one or more of the first precursor source 102, the second precursor source 104, the third precursor source 106, the first radical-generation apparatus 120 (if any), the second radical-generation apparatus 122 (if any), and the spatial ALD apparatus 108 are depicted in FIG. 3A.

With continued reference to FIG. 3A, the spatial ALD apparatus 108 is positioned downstream of the first precursor source 102 (and the first vaporization apparatus 116, if any), the second precursor source 104 (and the second vaporization apparatus 118, if any; and the first radical-generation apparatus 120, if any), the third precursor source 106 (and the second radical-generation apparatus 122, if any), and the other material source 110. The spatial ALD apparatus 108 includes a housing structure 126, and each of at least one distribution assembly 128 (e.g., distribution manifold) and at least one substrate holder 130 within the housing structure 126. The distribution assembly 128 and the substrate holder 130 may be spaced apart (e.g., separated, distanced) from one another within housing structure 126. The spatial ALD apparatus 108 may further include additional features (e.g., additional structures, additional devices), as described in further detail below.

The housing structure 126 of the spatial ALD apparatus 108 exhibits multiple inlets in fluid communication with the first precursor source 102, the second precursor source 104, the third precursor source 106, and the other material source 110, and configured and positioned to receive multiple gaseous feed (e.g., influent) streams; and at least outlet positioned to direct at least one exhaust (e.g., effluent) fluid stream comprising reaction byproducts and unreacted materials from the spatial ALD apparatus 108. The gaseous feed streams may for example, at least include a first gaseous feed stream including the first precursor (e.g., hydrazine-based compound including Si—N—Si bonds) previously described herein; a second gaseous feed stream including the second precursor (e.g., Si-centered radical) previously described herein, and/or material (e.g., Si-containing compound) employed to form the second precursor; and a third gaseous feed stream including the third precursor (e.g., N-centered radical) previously described herein, and/or material (e.g., N-containing molecule) employed to form the third precursor. The housing structure 126 may at least partially define at least one internal chamber 132 of the spatial ALD apparatus 108. The internal chamber 132 may surround and hold the distribution assembly 128 and the substrate holder 130 of the spatial ALD apparatus 108. The housing structure 126 may further include one or more sealable structures (e.g., lids, doors, windows) facilitating access to the internal chamber 132 to permit the insertion and removal of structures (e.g., substrates) into the internal chamber 132. By way of non-limiting example, as shown in FIG. 3A, the housing structure 126 may exhibit a sealable door 134. The housing structure 126 may be formed of and include any material (e.g., metal, alloy, glass, polymer, ceramic, composite, combination thereof) compatible with the operating conditions (e.g., temperatures, pressures, material exposures, generated electrical fields, generated magnetic fields) of the spatial ALD apparatus 108. In some embodiments, the housing structure 126 is formed of and includes stainless steel.

The substrate holder 130 is configured and positioned to support and temporarily hold at least one substrate 136 thereon. As shown in FIG. 3A, the substrate holder 130 may be mounted on at least one rod structure 138 operatively associated with a motor assembly 140. The rod structure 138 and the motor assembly 140 may, for example, be configured and operated to rotate the substrate holder 130 (and, hence, a substrate 136 thereon) during use and operation of the substrate holder 130. In some embodiments the rod structure 138 and the motor assembly 140 may also adjust the location of the substrate holder 130 (and, hence, a substrate 136 thereon) between a relatively lower position (e.g., for loading and unloading the substrate 136) and a relatively higher position (e.g., for processing the substrate 136). Optionally, the substrate holder 130 may be electrically connected to at least one signal generator 142 of the spatial ALD system 100. The signal generator 142 may include at least one power source (e.g., DC power source, an RF power source, an alternating current (AC) power source). The signal generator 142 may also include additional components, such as at least one waveform modulator having circuitry configured for modulation of the waveform, frequency, and amplitude of output signals. In additional embodiments, the signal generator 142 is omitted (e.g., absent) from the spatial ALD system 100.

The distribution assembly 128 is configured and positioned to direct materials of the gaseous feed streams received by the spatial ALD apparatus 108 into the internal chamber 132 of the spatial ALD apparatus 108. As shown in FIG. 3A, the distribution assembly 128 may include a plurality of ports 144 (e.g., gas ports) configured and positioned to introduce the materials of the gaseous feed streams into the internal chamber 132. For example, the distribution assembly 128 may include at least one first port 144A in fluid communication with the first precursor source 102 (and the first vaporization apparatus 116, if any); at least one second port 144B in fluid communication with the second precursor source 104 (and the second vaporization apparatus 118, if any; and the first radical-generation apparatus 120, if any); at least one third port 144C in fluid communication with the third precursor source 106 (and the second radical-generation apparatus 122, if any); and at least one fourth port 144D in fluid communication with the other material source 110 (if any). The ports 144 of the distribution assembly 128 may individually have a cross-sectional shape facilitating treatment of a desired portion (e.g., a wedge-shaped portion) of a substrate 136 held within the spatial ALD apparatus 108 (e.g., on the substrate holder 130) with the materials of the gaseous feed streams, as described in further detail below with reference to FIG. 3B.

Still referring to FIG. 3A, the spatial ALD apparatus 108 further includes a plurality of divider structures 146 within the internal chamber 132 thereof. The divider structures 146 may partition (e.g., divide) the internal chamber 132 into a plurality of different treatment regions 148 at least partially separated from one another by the divider structures 146. Each treatment region 148 may be horizontally bounded by some of the divider structures 146, and may be operatively associated with at least one of the ports 144 of the distribution assembly 128. The divider structures 146 may at least partially define the horizontal cross-sectional shape of the treatment regions 148 bound thereby. Some of the divider structures 146 may be interposed between horizontally neighboring ports 144 of the distribution assembly 128. The divider structures 146 may be employed to effectively limit the materials of the gaseous feed streams exiting the ports 144 of distribution assembly 128 that different portions (e.g., different wedge-shaped portions) of a substrate 136 held within the spatial ALD apparatus 108 are treated with during a deposition cycle of an ALD process of the disclosure, as described in further detail with reference to FIG. 3B.

As shown in FIG. 3A, in some embodiments, the divider structures 146 partition (e.g., divide) the internal chamber 132 of the spatial ALD apparatus 108 into at least one first treatment region 148A, at least one second treatment region 148B, at least one third treatment region 148C, and at least one fourth treatment region 148D. The at least one first treatment region 148A may be operatively associated with and may include the at least one first port 144A of the distribution assembly 128 within a horizontal area thereof. The at least one second treatment region 148B may be operatively associated with and may include the at least one second port 144B of the distribution assembly 128 within a horizontal area thereof. The at least one third treatment region 148C may be operatively associated with and may include the at least one third port 144C of the distribution assembly 128 within a horizontal area thereof. The at least one fourth treatment region 148D may be operatively associated with and may include the at least one fourth port 144D of the distribution assembly 128 within a horizontal area thereof.

The divider structures 146 within of the internal chamber 132 of the spatial ALD apparatus 108 may be positioned vertically over the substrate holder 130 of the spatial ALD apparatus 108. In addition, the divider structures 146 may be configured and positioned to vertically overlie and be offset from a substrate 136 held on substrate holder 130 during use and operation of the spatial ALD apparatus 108. In some embodiments, the divider structures 146 are integral features of the distribution assembly 128 of the spatial ALD apparatus 108. In additional embodiments, the divider structures 146 are discrete from (e.g., are not integral and continuous with) the distribution assembly 128 of the spatial ALD apparatus 108.

In some embodiments, one or more gaseous curtains are employed in place of or in conjunction with the divider structures 146 to partition (e.g., divide) the internal chamber 132 of the spatial ALD apparatus 108 into a plurality of treatment regions (e.g., the first treatment region 148A, the second treatment region 148B, the third treatment region 148C, the fourth treatment region 148D. If employed, the gaseous curtains may comprise a gaseous material (e.g., inert gas, $N_2$ gas) flowed within the internal chamber 132 in a desired pattern within internal chamber 132 to divide the internal chamber 132 into the different treatment regions, or to supplement (e.g., augment) the division of the internal chamber 132 provided by the divider structures 146.

Still referring to FIG. 3A, in some embodiments, one or more portions the distribution assembly 128 and/or the divider structures 146 are configured to generate glow discharge upon the application of voltage thereto. The glow discharge may be employed to generate plasma from materials of one or more of the gaseous feed streams being directed into the spatial ALD apparatus 108. The one or more portions of the distribution assembly 128 and/or the divider structures 146 may, for example, serve as electrode(s) of the spatial ALD apparatus 108. As shown in FIG. 3A, the one or more portions of the distribution assembly 128 and/or the divider structures 146 may be electrically connected to at least one additional signal generator 150 of the spatial ALD system 100. The additional signal generator 150 may include at least one power source (e.g., a variable DC power source, a variable RF power source). The additional signal generator 150 may also include additional components, such as at least one waveform modulator having circuitry configured for modulation of the waveform, frequency, and amplitude of output signals. In additional embodiments, the additional signal generator 150 is omitted (e.g., absent) from the spatial ALD system 100.

Figure 3B:
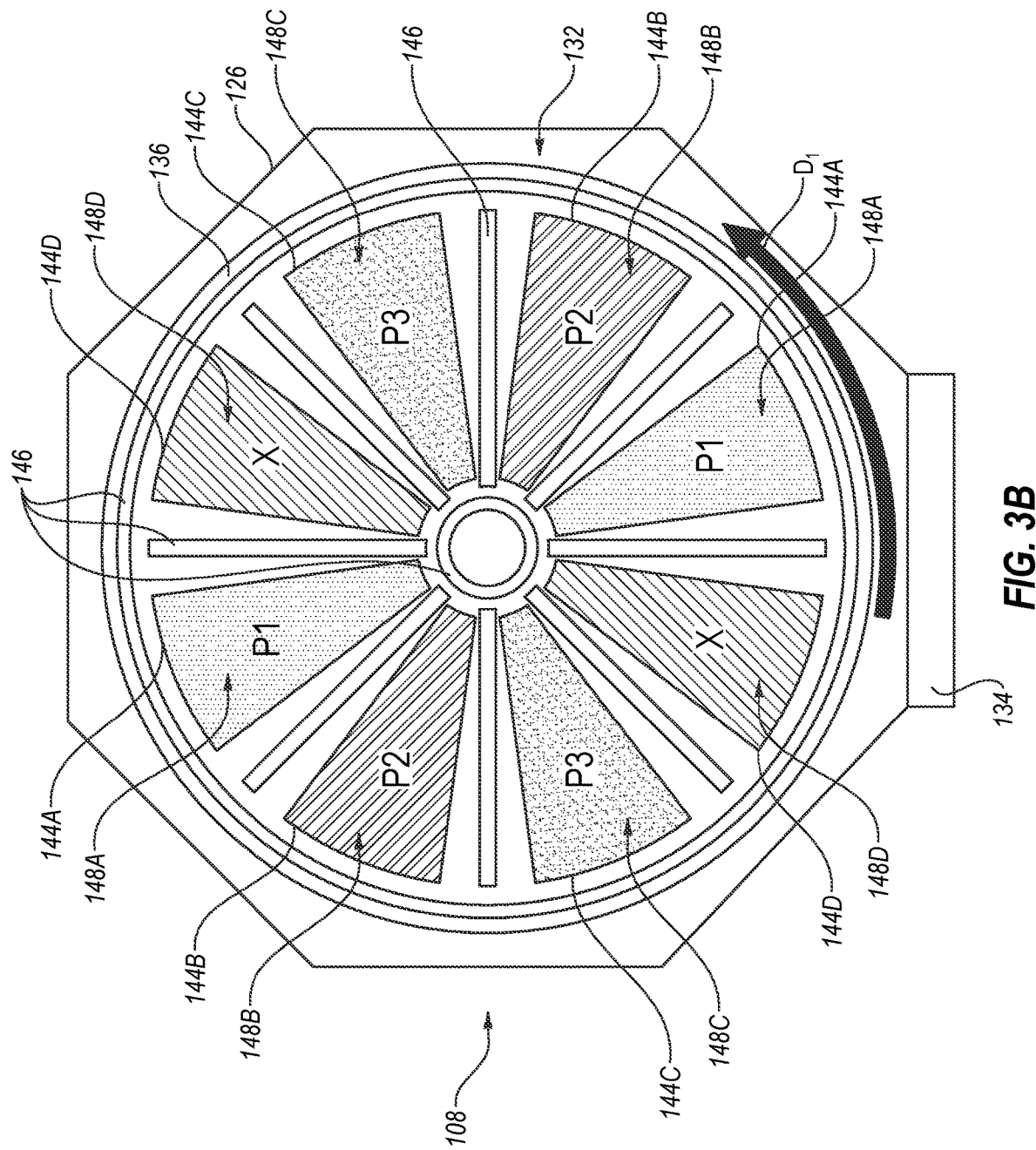
FIG. 3B simplified schematic view of an internal chamber of a spatial ALD apparatus of the spatial ALD system shown in FIG. 3A during use and operation of the spatial ALD system, in accordance with an embodiment of the disclosure

FIG. 3B shows simplified schematic view of the internal chamber 132 of the spatial ALD apparatus 108 of the spatial ALD system 100 shown in FIG. 3A during use and operation of the spatial ALD system 100, in accordance with embodiments of the disclosure. As shown in FIG. 3B, within the internal chamber 132, the divider structures 146 may be configured and positioned to provide individual treatment regions 148 of the internal chamber 132 a wedge-shaped horizontal cross-sectional shape. For example, the divider structures 146 may partition the internal chamber 132 into eight (8) different treatment regions 148 (e.g., two (2) first treatment regions 148A, two (2) second treatment regions 148B, two (2) third treatment regions 148C, and two (2) fourth treatment regions 148D) each exhibiting a wedge-shaped horizontal cross-sectional shape. In addition, the ports 144 (e.g., the first ports 144A, the second ports 144B, the third ports 144C, and the fourth ports 144D) of the distribution assembly 128 (FIG. 3A) may individually exhibit horizontal cross-sectional shapes complementary to the horizontal cross-sectional shapes of the treatment regions 148. For example, the first ports 144A, the second ports 144B, the third ports 144C, and the fourth ports 144D may each exhibit a wedge-shaped horizontal cross-sectional shape. In additional embodiments, one or more of the treatment regions 148 of the internal chamber 132 and/or one or more of the ports 144 of the distribution assembly 128 (FIG. 3A) may exhibit a different horizontal cross-sectional shape (e.g., non-wedge-shaped horizontal cross-sectional shape) than that depicted in FIG. 3B.

During use and operation of the spatial ALD apparatus 108, the substrate holder 130 (FIG. 3A) may be rotated in a direction Di (e.g., a counterclockwise direction) such that individual portions of a substrate 136 held on the substrate holder 130 (FIG. 3A) proceed through the different treatment regions (e.g., the first treatment regions 148A, the second treatment regions 148B, third treatment regions 148C, and the fourth treatment region 148D) of the internal chamber 132 of the spatial ALD apparatus 108 to facilitate the material deposition sequence previously described herein with reference to FIG. 2. For example, for an individual deposition cycle on a spatial ALD process of the disclosure, a given portion of the substrate 136 may be treated with the first precursor P1 within one of the first treatment regions 148A. Thereafter, the substrate holder 130 may be rotated in the direction Di to position the portion of the substrate 136 within one of the second treatment regions 148B neighboring the one of the first treatment regions 148A, wherein the portion may be treated with the second precursor P2. Next, the substrate holder 130 may be rotated again in the direction Di to position the portion of the substrate 136 within one of the third treatment regions 148C neighboring the one of the second treatment regions 148B, wherein the portion may be treated with the third precursor P3. Then, the substrate holder 130 may be rotated yet again in the direction Di to position the portion of the substrate 136 within one of the fourth treatment regions 148D neighboring the one of the third treatment regions 148C, wherein the portion may be treated with the other material X (if any) to complete one deposition cycle of a spatial ALD process of the disclosure. During the spatial ALD process, the first precursor P1, the second precursor P2, the third precursor P3, and the other material X (if any) may be flowed substantially continuously such that different portions of the substrate are being treated substantially simultaneously with one another but with different precursors or additional material (if any). For example, when one portion of the substrate 136 is within one of second treatment regions 148B being treated with the second precursor P2 (e.g., following treatment of the portion with the first precursor P1 with one of the first treatment regions 148A), another portion of the substrate 136 is within one of first treatment regions 148A being treated with the first precursor P1. Accordingly, different portions of the substrate 136 may be at different stages of the deposition cycle previously described with reference to FIG. 2 (as a non-limiting example) than one another during use and operation of the spatial ALD apparatus 108. The deposition cycle previously described with reference to FIG. 2 may be repeated a desired number of times for each portion of substrate 136 to form a seal material of the disclosure. Additional, non-limiting details for a spatial ALD process of the disclosure facilitated by the spatial ALD system 100 are provided below.

Within each first treatment region 148A of the internal chamber 132 of the spatial ALD apparatus 108, a portion of a substrate 136 held on the substrate holder 130 (FIG. 3A) may be treated with the first precursor P1 (e.g., hydrazine-based compound including Si—N—Si bonds, such as the compound previously described herein with reference to FIG. 1), and the first precursor P1 may react with uncoordinated sites at a surface of the substrate 136 to adsorb the first precursor P1 to the surface of the substrate 136. The surface of the substrate 136 may comprise a surface of a material (e.g., a chalcogenide material) formed separately from the spatial ALD process employed to form a seal material of the disclosure, or may comprise a temporary surface of the seal material formed through an earlier deposition cycle of the spatial ALD process.

Within each second treatment region 148B of the internal chamber 132 of the spatial ALD apparatus 108, a portion of a substrate 136 having the adsorbed first precursor thereon may be treated with the second precursor P2 (e.g., Si-centered radical), and the second precursor P2 may react with the adsorbed first precursor to form a secondary, intermediate material including Si from the second precursor P2. The secondary, intermediate material may subsequently be treated with at least the third precursor P3, as described in further detail below.

In some embodiments, the second precursor P2 is formed remote from (e.g., outside of) the second treatment region(s) 148B (e.g., within the first radical-generation apparatus 120 (FIG. 3A)) of the internal chamber 132 of the spatial ALD apparatus 108, and is introduced (e.g., directed, delivered) into the second treatment region 148B by way of at least one of the second ports 144B of the distribution assembly 128 (FIG. 3A) of the spatial ALD apparatus 108. In additional embodiments, at least some of the second precursor P2 is formed directly within (e.g., inside of) the second treatment region(s) 148B of the internal chamber 132 of the spatial ALD apparatus 108 from at least one Si-containing compound introduced to the second treatment region(s) 148B by way of at least one of the second ports 144B of the distribution assembly 128 (FIG. 3A). For example, one or more of the signal generators (e.g., one or more of the signal generator 142, and the additional signal generator 150) may apply a voltage to one or more components of the spatial ALD apparatus 108 to produce plasma within at least the second treatment region(s) 148B from materials (e.g., inert gases) within the second treatment region(s) 148B, and the plasma may interact with and excite the Si-containing compounds to form the second precursor P2.

Still referring to FIG. 3B, within each third treatment region 148C of the internal chamber 132 of the spatial ALD apparatus 108, a portion of a substrate 136 having the secondary, intermediate material thereon may be treated with the third precursor P3 (e.g., N-centered radical), and the third precursor P3 may react with the secondary, intermediate material to at least partially form a seal material including N from the third precursor P3. Optionally, the seal material may subsequently be treated with the other material X, as described in further detail below.

In some embodiments, the third precursor P3 is formed remote from (e.g., outside of) the third treatment region(s) 148C (e.g., within the first radical-generation apparatus 120 (FIG. 3A)) of the internal chamber 132 of the spatial ALD apparatus 108, and is introduced into the third treatment region(s) 148C by way of at least one of the third ports 144C of the distribution assembly 128 (FIG. 3A) of the spatial ALD apparatus 108. In additional embodiments, at least some of the third precursor P3 is formed directly within (e.g., inside of) the third treatment region(s) 148C from at least one N-containing molecule introduced to the third treatment region(s) 148C by way of at least one of the third ports 144C of the distribution assembly 128 (FIG. 3A). For example, one or more of the signal generators (e.g., one or more of the signal generator 142, and the additional signal generator 150) may apply a voltage to one or more components of the spatial ALD apparatus 108 to produce plasma within at least the third treatment region(s) 148C from materials (e.g., inert gases, Ni-containing molecules) within the third treatment region(s) 148C, and the plasma may interact with and excite the N-containing molecules to form the third precursor P3.

If the third precursor P3 is formed within the third treatment region(s) 148C of the internal chamber 132 of the spatial ALD apparatus 108 using generated plasma, relatively high frequencies may be employed to drive the plasma, such as frequencies greater than or equal to about 20 Megahertz (MHz) (e.g., within a range of from about 20 MHz to about 2.45 Gigahertz (GHz), such as from about 27 MHz to about 2.45 GHz, or from about 60 MHz to about 2.45 GHz). Such relatively high frequencies may limit ion energy function (IEDF) and promote radical reactions.

In addition, if the third precursor P3 is formed within the third treatment region(s) 148C of the internal chamber 132 of the spatial ALD apparatus 108 using generated plasma, the continuity (or discontinuity) of bias applied to a given component of the of the spatial ALD apparatus 108 over a given period of time may also be used to control characteristics of the seal material formed on or over the substrate 136. Pulsed signals (e.g., a pulsed RF (PRF) signal, a pulsed DC (PDC) signal) may be employed to bias different components of the spatial ALD apparatus 108, and/or non-pulsed signals (e.g., continuous signals, such as a continuous RF signal, a continuous DC signal) employed to bias different components of the spatial ALD apparatus 108. In some embodiments, pulsed signals including bursts of current (e.g., RF current, DC) are employed to bias one or more components of the spatial ALD apparatus 108. Pulsing the applied current may, for example, facilitate heat dissipation during the silent period. If pulsed signals are employed, the duty cycle (ti/Ti, wherein ti is the pulse width and Ti is the frequency at which the signal is pulsed or modulated) of the applied bias waveform may be controlled to facilitate desirable characteristics in the seal material formed on or over the substrate 136. For example, increasing the duty cycle of a bias waveform applied to the substrate holder 130 may reduce (or even eliminate) undesirable impurities and/or void spaces (e.g., resulting from at least some of the impurities, following anneal) within the seal material.

Furthermore, if the third precursor P3 is formed within the third treatment region(s) 148C of the internal chamber 132 of the spatial ALD apparatus 108 using generated plasma, one or more ion filter structures may be included in the third treatment region(s) 148C to at least partially separate formed ions (e.g., formed nitrogen ions, other formed ions) from the third precursor P3 (e.g., N-centered radical). The third precursor P3 may continue toward and interact (e.g., react) with the secondary, intermediate material, while at least some of the ions maybe prevented from continuing toward and interacting with the secondary, intermediate material. Accordingly, the ion filter structure(s) may reduce exposure of the secondary, intermediate material to ions formed within the third treatment region(s) 148C relative to the third precursor P3 formed within the third treatment region(s) 148C.

Still referring to FIG. 3B, optionally, within each fourth treatment region 148D of the internal chamber 132 of the spatial ALD apparatus 108, a portion of a substrate 136 having the seal material thereon may be treated with the other material X. In some embodiments, the other material X is employed as a purge material to remove undesirable materials (e.g., reaction byproducts, remaining precursor(s)) from the internal chamber 132 of the spatial ALD apparatus 108. As a non-limiting example, the other material X may comprise $N_2$ gas and/or an inert gas. In additional embodiments, the other material X is employed to further treat the seal material to modify one or more properties (e.g., physical properties) thereof. As a non-limiting example, the other material X may comprise plasma (e.g., N-containing plasma). In such embodiments, if the other material X comprises a plasma, the plasma may be formed remote from (e.g., outside of) the fourth treatment region(s) 148D, or may be formed directly within (e.g., inside of) the fourth treatment region(s) 148D.

In some embodiments, as a result of at least the first precursor (e.g., hydrazine-based compound including Si—N—Si bonds, such as the compound previously described herein with reference to FIG. 1) employed in the spatial ALD process of the disclosure, the operational temperature of the spatial ALD apparatus 108 during the formation of a seal material of the disclosure may be less than or equal to about 550° C., such as within a range of from about 200° C. to about 550° C. The operational temperature of the spatial ALD apparatus 108 may be significantly lower than operational temperatures required by many conventional ALD apparatuses and conventional ALD processes employed to form a seal material on or over a substrate.

While use and operation of the spatial ALD system 100 (FIG. 3A) (including use and operation of the spatial ALD apparatus 108 thereof) to effectuate the material deposition sequence of the deposition cycle illustrated in FIG. 2 has been described herein with reference to FIG. 3B, the disclosure is not so limited. Rather, the spatial ALD system 100 (including the spatial ALD apparatus 108 thereof) may be operated to effectuate different material deposition sequences (e.g., different sequences of the first precursor P1, the second precursor P2, the third precursor P3, the other material X (if any)) of different deposition cycles, as desired, including, but not limited to the other material deposition sequences of the other potential deposition cycles previously described herein.

Figure 4:
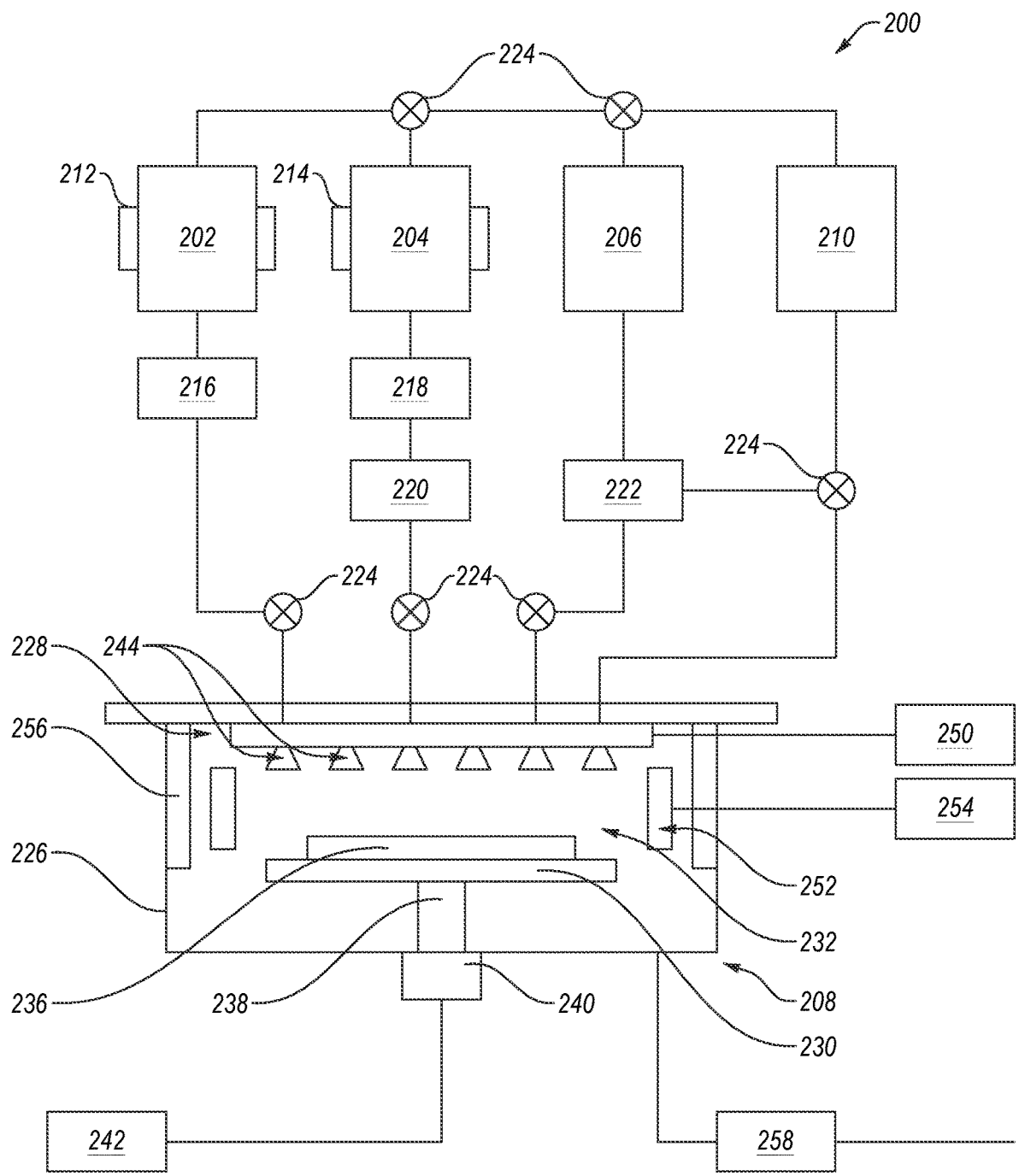
FIG. 4 is a simplified schematic view of a time-divided ALD system, in accordance with an embodiment of the disclosure.

FIG. 4 is a simplified schematic view of a time-divided ALD system 200, in accordance with an embodiment of the disclosure. The time-divided ALD system 200 may be used to produce a microelectronic device structure including a seal material of the disclosure through a time-divided ALD process, as described in further detail below. As shown in FIG. 4, the time-divided ALD system 200 may include a first precursor source 202, a second precursor source 204, a third precursor source 206, and at least one time-divided ALD apparatus 208. The time-divided ALD apparatus 208 may be in selective (subject to operator or system control) fluid communication with each of the first precursor source 202, the second precursor source 204, and the third precursor source 206. The time-divided ALD system 200 may further include additional apparatuses operatively associated with one or more of the first precursor source 202, the second precursor source 204, the third precursor source 206, and the time-divided ALD apparatus 208, as described in further detail below.

The first precursor source 202, the second precursor source 204, and the third precursor source 206 may respectively be substantially similar to and may contain substantially the same materials as the first precursor source 102, the second precursor source 104, and the third precursor source 106 previously described with reference to FIG. 3A. In addition, optionally, the time-divided ALD system 200 may also include at least one other material source 210 in selective (e.g., subject to operator or system control) fluid communication with one or more (e.g., each) of the first precursor source 202, the second precursor source 204, the third precursor source 206, and the time-divided ALD apparatus 208. If present, the other material source 210 may be substantially similar to and may contain substantially the same material as the other material source 110 previously described with reference to FIG. 3A.

The time-divided ALD system 200 may, optionally, further include one or more heating apparatuses operatively associated with one or more of the first precursor source 202, the second precursor source 204, the third precursor source 206, and the other material source 210. By way of non-limiting example, as shown in FIG. 4, the time-divided ALD system 200 may include a first heating apparatus 212 operatively associated with the first precursor source 202, and a second heating apparatus 214 operatively associated with the second precursor source 204. The first heating apparatus 212 may be employed to heat or maintain a first precursor (e.g., a hydrazine-based compound including Si—N—Si bonds) at a desired temperature within the first precursor source 202, such as a temperature facilitating flowability of the first precursor. The second heating apparatus 214 may be employed to heat or maintain the material (e.g., a Si-containing compound) employed to form a second precursor (e.g., a Si-centered radical) at a desired temperature within the second precursor source 204, such as a temperature facilitating flowability of the material employed to form the second precursor.

Still referring to FIG. 4, the time-divided ALD system 200 may, optionally, further include one or more vaporization apparatuses (e.g., one or more ampules) operatively associated with one or more of the first precursor source 202, the second precursor source 204, the third precursor source 206, and the other material source 210. By way of non-limiting example, if the first precursor source 202 and the second precursor source 204 are configured and operated to contain the materials held therein (e.g., the first precursor, a material to be employed to form the second precursor) in a liquid state, the time-divided ALD system 200 may include a first vaporization apparatus 216 downstream of the first precursor source 202, and a second vaporization apparatus 218 downstream of the second precursor source 204. The first vaporization apparatus 216 may be configured and operated to receive a first fluid stream including a liquid form of the first precursor from the first precursor source 202, and to vaporize the liquid form of the first precursor to form a gaseous form of the first precursor that may then be directed toward the time-divided ALD apparatus 208. The second vaporization apparatus 218 may be configured and operated to receive a second fluid stream including a liquid form of material to be used to form second precursor from the second precursor source 204, and to vaporize the liquid form of the material to form a gaseous form of the material that may then be directed toward the time-divided ALD apparatus 208. In addition embodiments, the time-divided ALD system 200 may include a single (e.g., only one) vaporization apparatus in selective (e.g., subject to operator or system control) fluid communication with each of the first precursor source 202 and the second precursor source 204. The single vaporization apparatus may for example, be configured and operated to vaporize material (e.g., a liquid form of the first precursor, a liquid form of a material employed to form the second precursor) received from each of the first precursor source 202 and the second precursor source 204 at different times during a time-divided ALD process of the disclosure.

Optionally, the time-divided ALD system 200 may further include one or more radical-generation apparatuses (e.g., remote plasma sources, laser energy sources, microwave energy sources) operatively associated with one or more of the first precursor source 202, the second precursor source 204, the third precursor source 206, and the other material source 210. By way of non-limiting example, the time-divided ALD system 200 may include a first radical-generation apparatus 220 downstream of the second precursor source 204 (and the second vaporization apparatus 218, if any), and a second radical-generation apparatus 222 downstream of the third precursor source 206. In some embodiments, one or more of the first radical-generation apparatus 220 and the second radical-generation apparatus 222 are also downstream of the other material source 210. The first radical-generation apparatus 220 may be configured and operated to receive a gaseous form of the material (e.g., Si-containing compound) contained in the second precursor source 204 (e.g., from the second vaporization apparatus 218) and to generate the second precursor (e.g., Si-centered radical) previously described herein therefrom. The second precursor may then be directed toward the time-divided ALD apparatus 208. The second radical-generation apparatus 222 may be configured and operated to receive a gaseous form of the material (e.g., N-containing molecule) contained in the third precursor source 206 and to generate the third precursor (e.g., N-centered radical) previously described herein therefrom. The third precursor may then be directed toward the time-divided ALD apparatus 208. In additional embodiments, such as embodiments where one or more (e.g., each) of the second precursor and the third precursor are formed within the time-divided ALD apparatus 208 (e.g., as opposed to remote from the time-divided ALD apparatus 208), one or more of the first radical-generation apparatus 220 and the second radical-generation apparatus 222 are omitted (e.g., absent) from the time-divided ALD system 200.

As shown in FIG. 4, the time-divided ALD system 200 may further include various valves 224 operatively associated with one or more of the first precursor source 202, the second precursor source 204, the third precursor source 206, and the other material source 210. Some of the valves 224 may, for example, be configured and positioned to selectively (e.g., subject to operator or system control) establish (and, as desired, terminate) fluid communication between the other material source 210 and one or more of the first precursor source 202, the second precursor source 204, the third precursor source 206, the first radical-generation apparatus 220 (if any), the second radical-generation apparatus 222 (if any), and the time-divided ALD apparatus 208. For clarity and ease of understanding the drawings and associated description, not all potential valve (and, hence, piping) configurations and positions that may be utilized to selectively establish (and, as desired, terminate) fluid communication between the other material source 210 and one or more of the first precursor source 202, the second precursor source 204, the third precursor source 206, the first radical-generation apparatus 220 (if any), the second radical-generation apparatus 222 (if any), and the time-divided ALD apparatus 208 are depicted in FIG. 4.

With continued reference to FIG. 4, the time-divided ALD apparatus 208 is positioned downstream of the first precursor source 202 (and the first vaporization apparatus 216, if any), the second precursor source 204 (and the second vaporization apparatus 218, if any; and the first radical-generation apparatus 220, if any), the third precursor source 206 (and the second radical-generation apparatus 222, if any), and the other material source 210. The time-divided ALD apparatus 208 includes a housing structure 226, and each of at least one distribution assembly 228 (e.g., distribution manifold) and at least one substrate holder 230 within the housing structure 226. The distribution assembly 228 and the substrate holder 230 may be spaced apart (e.g., separated, distanced) from one another within housing structure 226. The time-divided ALD apparatus 208 may further include additional features (e.g., additional structures, additional devices), as described in further detail below.

The housing structure 226 of the time-divided ALD apparatus 208 exhibits multiple inlets in fluid communication with the first precursor source 202, the second precursor source 204, the third precursor source 206, and the other material source 210, and configured and positioned to receive multiple gaseous feed (e.g., influent) streams; and at least outlet positioned to direct at least one exhaust (e.g., effluent) fluid stream comprising reaction byproducts and unreacted materials from the time-divided ALD apparatus 208. The gaseous feed streams may for example, at least include a first gaseous feed stream including the first precursor (e.g., hydrazine-based compound including Si—N—Si bonds) previously described herein; a second gaseous feed stream including the second precursor (e.g., Si-centered radical) previously described herein, and/or material (e.g., Si-containing compound) employed to form the second precursor; and a third gaseous feed stream including the third precursor (e.g., N-centered radical) previously described herein, and/or material (e.g., N-containing molecule) employed to form the third precursor. The housing structure 226 may at least partially define at least one internal chamber 232 of the time-divided ALD apparatus 208. The internal chamber 232 may surround and hold the distribution assembly 228 and the substrate holder 230 of the time-divided ALD apparatus 208. The housing structure 226 may further include one or more sealable structures (e.g., lids, doors, windows) facilitating access to the internal chamber 232 to permit the insertion and removal of structures (e.g., substrates) into the internal chamber 232. The housing structure 226 may be formed of and include any material (e.g., metal, alloy, glass, polymer, ceramic, composite, combination thereof) compatible with the operating conditions (e.g., temperatures, pressures, material exposures, generated electrical fields, generated magnetic fields) of the time-divided ALD apparatus 208. In some embodiments, the housing structure 226 is formed of and includes stainless steel.

The substrate holder 230 is configured and positioned to support and temporarily hold at least one substrate 236 thereon. As shown in FIG. 4, the substrate holder 230 may be mounted on at least one rod structure 238 operatively associated with a motor assembly 240. The rod structure 238 and the motor assembly 240 may, for example, be configured and operated to adjust the location of the substrate holder 230 (and, hence, a substrate 236 thereon) between a relatively lower position (e.g., for loading and unloading the substrate 236) and a relatively higher position (e.g., for processing the substrate 236). Optionally, the substrate holder 230 may be electrically connected to at least one signal generator 242 of the time-divided ALD system 200. The signal generator 242 may include at least one power source (e.g., DC power source, an RF power source, an alternating current (AC) power source). The signal generator 242 may also include additional components, such as at least one waveform modulator having circuitry configured for modulation of the waveform, frequency, and amplitude of output signals. In additional embodiments, the signal generator 242 is omitted (e.g., absent) from the time-divided ALD system 200.

The distribution assembly 228 is configured and positioned to direct materials of the gaseous feed streams received by the time-divided ALD apparatus 208 into the internal chamber 232 of the time-divided ALD apparatus 208. As shown in FIG. 4, the distribution assembly 228 may include a plurality of ports 244 (e.g., gas ports) configured and positioned to introduce the materials of the gaseous feed streams into the internal chamber 232. The ports 244 may be in fluid communication with the first precursor source 202 (and the first vaporization apparatus 216, if any), the second precursor source 204 (and the second vaporization apparatus 218, if any; and the first radical-generation apparatus 220, if any), the third precursor source 206 (and the second radical-generation apparatus 222, if any), and the other material source 210 (if any). The ports 244 may introduce different materials of different gaseous feed streams into the internal chamber 232 at different times than one another by controlling at least some of the valves 224 of the time-divided ALD system 200. For example, as described in further detail below, for each act (e.g., the first act, the second act, the third act, and the forth act previously described herein with reference to FIG. 2) of a given deposition cycle of a time-divided ALD process employing the time-divided ALD system 200, one or more of the valves 224 upstream of the time-divided ALD apparatus 208 may be selectively opened (subject to operator or system control) while one or more other of the valves 224 upstream of the time-divided ALD apparatus 208 may be selectively closed. The valves 224 of the time-divided ALD system 200 at least partially control the flow and duration of the different gaseous feed streams directed toward the time-divided ALD apparatus 208, and hence at least partially control the material deposition sequence of each deposition cycle of the time-divided ALD process employing the time-divided ALD system 200.

Still referring to FIG. 4, optionally, the time-divided ALD apparatus 208 may further at least one coil structure 252 positioned between the distribution assembly 228 and the substrate holder 230 within the internal chamber 232 of the time-divided ALD apparatus 208. The coil structure 252 may be configured and operated to assist in generating and/or maintaining plasma between the distribution assembly 228 and the substrate 236. As described in further detail below, the coil structure 252 may be configured and operated to inductively couple energy into plasma produced within the internal chamber 232 to induce electromagnetic currents in the plasma. The electromagnetic currents may heat the plasma by Ohmic heating to sustain the plasma in a steady state. As shown in FIG. 4, if present, the coil structure 252 may be electrically connected to at least one further signal generator 254 of the time-divided ALD system 200. The further signal generator 254 may include at least one additional power source (e.g., an RF power source, a DC power source). The further signal generator 254 may also include additional components, such as an impedance-matching network. The coil structure 252 may act as first windings of a transformer. In additional embodiments, the coil structure 252 is omitted (e.g., absent) from the time-divided ALD apparatus 208.

With continued reference to FIG. 4, the time-divided ALD apparatus 208 may, optionally, further include at least one heating device 256 operatively associated with the internal chamber 232 thereof. The heating device 256, if present, may comprise at least one device (e.g., a radiation heater; combustion heater; a nuclear heater; a sonication heater; an electrical resistance heater; an inductive heater; an electromagnetic heater, such as an infrared heater and/or a microwave heater) configured and operated to heat at least a portion of the internal chamber 232 during use and operation of the time-divided ALD apparatus 208. The heating device 256 may be employed to heat or maintain one or more portions of the internal chamber 232 at a desired temperature, such as a temperature facilitating the formation of a seal material through a time-divided ALD process of the disclosure. In some embodiments, the heating device 256 is configured and positioned to facilitate a temperature within the internal chamber 232 greater than or equal to about 200° C., such as within a range of from about 200° C. to about 550° C. In additional embodiments, such as some embodiments wherein the materials directed into the internal chamber 232 do not require supplemental heating to form a desired seal material through time-divided ALD, the heating device 256 is omitted (e.g., absent) from the time-divided ALD apparatus 208.

Still referring to FIG. 4, optionally, the time-divided ALD system 200 may further include at least one vacuum apparatus 258 (e.g., negative pressure apparatus) operatively associated with at least one outlet of the housing structure 226 of the time-divided ALD apparatus 208. If present, the vacuum apparatus 258 may be configured and operated to assist with the control of pressure within the internal chamber 232 of the time-divided ALD apparatus 208, as well as the removal of reaction byproducts and/or unreacted materials (e.g., unreacted precursor materials, unreacted derivatives thereof, unreacted additional materials) from the internal chamber 232 of the time-divided ALD apparatus 208. The vacuum apparatus 258 may be configured and operated to apply negative pressure to the internal chamber 232 of the time-divided ALD apparatus 208. In additional embodiments, the vacuum apparatus 258 is omitted (e.g., absent) from the time-divided ALD system 200.

During use and operation of the time-divided ALD system 200, the substrate 236 may be delivered into the time-divided ALD apparatus 208. The substrate 236 may be provided into the internal chamber 232 of the time-divided ALD apparatus 208 by any desired means. In some embodiments, one or more conventional robotics apparatuses (e.g., robotic arms, robots) are employed to deliver the substrate 236 into the time-divided ALD apparatus 208.

After delivering the substrate 236 into the time-divided ALD apparatus 208, different gaseous feed streams may be introduced, by way of the ports 244, into the internal chamber 232 in sequence to form a seal material of the disclosure. The sequence with which the different gaseous feed streams are introduced corresponds to a desired material deposition sequence for an individual deposition cycle of a time-divided ALD process of the disclosure. In some embodiments, at least one individual deposition cycle follows the material deposition sequence previously described herein with reference to FIG. 2. For example, in a first act of the deposition cycle the first precursor P1 may be introduced into the internal chamber 232 by way of the ports 244.

Thereafter, in a second act, the flow of the first precursor P1 into the internal chamber 232 may be stopped, and one or more of the second precursor P2 and a material used to form the second precursor P2 may be introduced into the internal chamber 232 by way of the ports 244. Next, in a third act, the flow of the second precursor P2 into the internal chamber 232 may be stopped, and one or more of the third precursor P3 and a material used to form the third precursor P3 may be introduced into the internal chamber 232 by way of the ports 244. Then, in a fourth act, the flow of the third precursor P3 into the internal chamber 232 may be stopped, and the other material X (if any) may be introduced into the internal chamber 232 by way of the ports 244 to complete one deposition cycle of an time-divided ALD process of the disclosure. The deposition cycle previously described with reference to FIG. 2 may be repeated a desired number of times to form a seal material of the disclosure. Additional, non-limiting details for a time-divided ALD process of the disclosure facilitated by the time-divided ALD system 200 are provided below.

In some embodiments, in a first act of a deposition cycle of a time-divided ALD process of the disclosure, a gaseous form of the first precursor P1 (e.g., hydrazine-based compound including Si—N—Si bonds, such as the compound previously described herein with reference to FIG. 1) is flowed into the internal chamber 232 of the time-divided ALD apparatus 208 by way of the ports 244 of the distribution assembly 228. The first precursor P1 may then react with uncoordinated sites at a surface of the substrate 236 to adsorb (e.g., chemisorb) the first precursor P1 to the surface of the substrate 236. The surface of the substrate 236 may comprise a surface of a material (e.g., a chalcogenide material) formed separately from the time-divided ALD process employed to form a seal material of the disclosure, or may comprise a temporary surface of the seal material formed through an earlier deposition cycle of the time-divided ALD process.

Next, in a second act of the deposition cycle, the flow of the gaseous form of the first precursor P1 may be stopped (e.g., by way of one or more of the valves 224), and a gaseous form of one or more of the second precursor P2 (e.g., Si-centered radical) and a material (e.g., Si-containing compound) employed to form the second precursor P2 is flowed into the internal chamber 232 of the time-divided ALD apparatus 208 by way of the ports 244 of the distribution assembly 228. Thereafter, the second precursor P2 may react with the adsorbed first precursor to form a secondary, intermediate material including Si from the second precursor P2.

In some embodiments, the second precursor P2 is formed remote from (e.g., outside of) the internal chamber 232 of the time-divided ALD apparatus 208, and is introduced (e.g., directed, delivered) into the internal chamber 232 by way of the ports 244 of the distribution assembly 228 of the time-divided ALD apparatus 208. In additional embodiments, at least some of the second precursor P2 is formed directly within (e.g., inside of) the internal chamber 232 of the time-divided ALD apparatus 208 from at least one Si-containing compound introduced to the internal chamber 232 by way of at least one of the ports 244 of the distribution assembly 228. For example, one or more of the signal generators (e.g., one or more of the signal generator 242, the additional signal generator 250, and the further signal generator 254) may apply a voltage to one or more components of the time-divided ALD apparatus 208 to produce plasma within the internal chamber 232, and the plasma may interact with and excite the Si-containing compounds to form the second precursor P2.

Next, in a third act of the deposition cycle, the flow of the gaseous form of one or more of the second precursor P2 and the material employed to form the second precursor P2 may be stopped (e.g., by way of one or more of the valves 224), and a gaseous form of one or more of the third precursor P3 (e.g., N-centered radical) and a material (e.g., N-containing molecule) employed to form the third precursor P3 is flowed into the internal chamber 232 of the time-divided ALD apparatus 208 by way of the ports 244 of the distribution assembly 228. Thereafter, the third precursor P3 may react with the secondary, intermediate material to at least partially form a seal material including N from the third precursor P3.

In some embodiments, the third precursor P3 is formed remote from (e.g., outside of) the internal chamber 232 of the time-divided ALD apparatus 208 (e.g., within the first radical-generation apparatus 220), and is introduced into the internal chamber 232 by way of the ports 244 of the distribution assembly 228 of the time-divided ALD apparatus 208. In additional embodiments, at least some of the third precursor P3 is formed directly within (e.g., inside of) the internal chamber 232 from at least one N-containing molecule introduced to the internal chamber 232 by way of the ports 244 of the distribution assembly 228. For example, one or more of the signal generators (e.g., one or more of the signal generator 242, the additional signal generator 250, and the further signal generator 254) may apply a voltage to one or more components of the time-divided ALD apparatus 208 to produce plasma within the internal chamber 232, and the plasma may interact with and excite the N-containing molecules to form the third precursor P3.

If the third precursor P3 is formed within the internal chamber 232 of the time-divided ALD apparatus 208 using generated plasma, relatively high frequencies may be employed to drive the plasma, such as frequencies greater than or equal to about 20 MHz (e.g., within a range of from about 20 MHz to about 2.45 GHz, such as from about 27 MHz to about 2.45 GHz, or from about 60 MHz to about 2.45 GHz). Such relatively high frequencies may limit IEDF and promote radical reactions.

In addition, if the third precursor P3 is formed within the internal chamber 232 of the time-divided ALD apparatus 208 using generated plasma, the continuity (or discontinuity) of bias applied to a given component of the of the time-divided ALD apparatus 208 over a given period of time may also be used to control characteristics of the seal material formed on or over the substrate 236. Pulsed signals (e.g., a PRF signal, a PDC signal) may be employed to bias different components of the time-divided ALD apparatus 208, and/or non-pulsed signals (e.g., continuous signals, such as a continuous RF signal, a continuous DC signal) employed to bias different components of the time-divided ALD apparatus 208. In some embodiments, pulsed signals including bursts of current (e.g., RF current, DC) are employed to bias one or more components of the time-divided ALD apparatus 208. Pulsing the applied current may, for example, facilitate heat dissipation during the silent period. If pulsed signals are employed, the duty cycle (ti/Ti, wherein ti is the pulse width and Ti is the frequency at which the signal is pulsed or modulated) of the applied bias waveform may be controlled to facilitate desirable characteristics in the seal material formed on or over the substrate 236. For example, increasing the duty cycle of a bias waveform applied to the substrate holder 230 may reduce (or even eliminate) undesirable impurities and/or void spaces (e.g., resulting from at least some of the impurities, following anneal) within the seal material.

Furthermore, if the third precursor P3 is formed within the internal chamber 232 of the time-divided ALD apparatus 208 using generated plasma, one or more ion filter structures may be included in the internal chamber 232 to at least partially separate formed ions (e.g., formed nitrogen ions, other formed ions) from the third precursor P3 (e.g., N-centered radical). The third precursor P3 may continue toward and interact (e.g., react) with the secondary, intermediate material, while at least some of the ions maybe prevented from continuing toward and interacting with the secondary, intermediate material. Accordingly, the ion filter structure(s) may reduce exposure of the secondary, intermediate material to ions formed within the internal chamber 232 relative to the third precursor P3 formed within the internal chamber 232.

Still referring to FIG. 4, in a fourth act of the deposition cycle, the flow of the gaseous form of one or more of the third precursor P3 and the material employed to form the third precursor P3 may be stopped (e.g., by way of one or more of the valves 224), and the other material X (in any) may be flowed into the internal chamber 232 of the time-divided ALD apparatus 208 by way of the ports 244 of the distribution assembly 228. Thereafter, the seal material formed on or over the substrate 236 may be treated with the other material X. In some embodiments, the other material X is employed as a purge material to remove undesirable materials (e.g., reaction byproducts, remaining precursor(s)) from the internal chamber 232 of the time-divided ALD apparatus 208. As a non-limiting example, the other material X may comprise $N_2$ gas and/or an inert gas. In additional embodiments, the other material X is employed to further treat the seal material to modify one or more properties (e.g., physical properties) thereof. As a non-limiting example, the other material X may comprise plasma (e.g., N-containing plasma). In such embodiments, if the other material X comprises a plasma, the plasma may be formed remote from (e.g., outside of) the internal chamber 232, or may be formed directly within (e.g., inside of) the internal chamber 232.

In some embodiments, as a result of at least the first precursor (e.g., hydrazine-based compound including Si—N—Si bonds, such as the compound previously described herein with reference to FIG. 1) employed in the time-divided ALD process of the disclosure, the operational temperature of the time-divided ALD apparatus 208 during the formation of a seal material of the disclosure may be less than or equal to about 550° C., such as within a range of from about 200° C. to about 550° C. The operational temperature of the time-divided ALD apparatus 208 may be significantly lower than operational temperatures required by many conventional ALD apparatuses and conventional ALD processes employed to form a seal material on or over a substrate.

While use and operation of the time-divided ALD system 200 (including use and operation of the time-divided ALD apparatus 208 thereof) to effectuate the material deposition sequence of the deposition cycle illustrated in FIG. 2 has been described herein with reference to FIG. 4, the disclosure is not so limited. Rather, the time-divided ALD system 200 (including the time-divided ALD apparatus 208 thereof) may be operated to effectuate different material deposition sequences (e.g., different sequences of the first precursor P1, the second precursor P2, the third precursor P3, the other material X (if any)) of different deposition cycles, as desired, including, but not limited to the other material deposition sequences of the other potential deposition cycles previously described herein.

Thus, in accordance with embodiments of the disclosure, a method of forming a microelectronic device comprises treating a base structure with a first precursor to adsorb the first precursor to a surface of the base structure and form a first material. The first precursor comprises a hydrazine-based compound including Si—N—Si bonds. The first material is treated with a second precursor to covert the first material into a second material. The second precursor comprises a Si-centered radical. The second material is treaded with a third precursor to covert the second material into a third material comprising Si and N. The third precursor comprises an N-centered radical.

Furthermore, ALD system according to embodiments of the disclosure comprises a first source, a second source, a third source, and an ALD apparatus downstream of and in fluid communication with each of the first source, the second source, and the third source. The first source is configured to contain a hydrazine-based compound including Si—N—Si bonds. The third source is configured to contain an N-containing molecule. The ALD apparatus comprises a housing structure, a distribution assembly, and a substrate holder. The housing structure defines an internal chamber. The distribution assembly is configured to receive and direct gaseous forms of each of the hydrazine-based compound, the Si-containing compound, and the N-containing molecule into the internal chamber. The substrate holder is within the internal chamber and is configured to hold a base structure thereon.

Moreover, in accordance with embodiments of the disclosure, a method of forming a seal material through ALD comprises directing a first gaseous stream comprising a hydrazine-based compound including Si—N—Si bonds into an internal chamber of an ALD apparatus to chemisorb the hydrazine-based compound to a base structure held within the internal chamber. A second gaseous stream comprising one or more of a Si-containing compound and a Si-centered radical is directed into the internal chamber to react with the chemisorbed hydrazine-based compound and form an intermediate material. A third gaseous stream comprising one or more of an N-containing compound and an N-centered radical is directed into the internal chamber to react with the intermediate material and form at least a portion of the seal material.

The ALD systems (e.g., the spatial ALD system 100 (FIG. 3A), the time-divided ALD system 200 (FIG. 4)), methods (e.g., spatial ALD process, time-divided ALD process) of the disclosure facilitate reduced costs (e.g., manufacturing costs, material costs), increased miniaturization of components, improved performance, and greater packaging density as compared to conventional material deposition systems (e.g., conventional ALD systems) and conventional methods (e.g., conventional ALD processes). The ALD systems and methods of the disclosure may improve scalability, quality, efficiency, and simplicity as compared to conventional material deposition systems and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A method of forming a microelectronic device, comprising:
   treating a base structure with a first precursor to adsorb the first precursor to a surface of the base structure and form a first material, the first precursor comprising a hydrazine-based compound including Si—N—Si bonds;
   treating the first material with a second precursor to convert the first material into a second material, the second precursor comprising a Si-centered radical; and
   treating the second material with a third precursor to convert the second material into a third material comprising Si and N, the third precursor comprising an N-centered radical.

2. The method of claim 1, wherein the first precursor has the following structure:

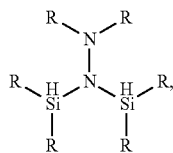

where each R is individually hydrogen, an unsubstituted alkyl group, a substituted alkyl group, an unsubstituted aryl group, a substituted aryl group, an unsubstituted heteroaryl group, or a substituted heteroaryl group.

3. The method of claim 2, wherein each R is a methyl group.

4. The method of claim 1, further comprising effectuating each of treatment of the base structure with the first precursor, treatment of the first material with the second precursor, and treatment the second material with the third precursor within an atomic layer deposition (ALD) apparatus by way of an ALD process.

5. The method of claim 4, wherein treating the first material with the second precursor comprises:
   forming the second precursor from a Si-containing compound within a radical-generation apparatus upstream of the ALD apparatus; and
   directing the second precursor into the ALD apparatus.

6. The method of claim 4, wherein treating the first material with the second precursor comprises:
   directing a gaseous form of a Si-containing compound into the ALD apparatus; and
   forming the second precursor within the ALD apparatus from the Si-containing compound.

7. The method of claim 4, wherein treating the second material with the third precursor comprises:
   forming the third precursor from a N-containing compound within a radical-generation apparatus upstream of the ALD apparatus; and
   directing the third precursor into the ALD apparatus.

8. The method of claim 4, wherein treating the second material with the third precursor comprises:
   directing a gaseous form of a N-containing molecule into the ALD apparatus; and
   forming the third precursor within the ALD apparatus from the N-containing molecule.

9. The method of claim 8, wherein forming the third precursor within the ALD apparatus from the N-containing molecule comprises interacting the N-containing molecule with plasma generated within the ALD apparatus to excite the N-containing molecule and form the third precursor therefrom.

10. The method of claim 9, further comprising driving the plasma with a frequency greater than or equal to about 20 Megahertz.

11. The method of claim 9, further comprising separating ions generated from the plasma from the third precursor before treating the second material with the third precursor.

12. The method of claim 4, further comprising selecting the ALD apparatus to comprise a spatial ALD apparatus.

13. The method of claim 4, further comprising selecting the ALD apparatus to comprise a time-divided ALD apparatus.

14. The method of claim 4, further comprising effectuating the ALD process at a temperature within a range of from about 200° C. to about 550° C.

15. An atomic layer deposition (ALD) system, comprising:
   a first source configured to contain a hydrazine-based compound including Si—N—Si bonds;
   a second source configured to contain a Si-containing compound;
   a third source configured to contain an N-containing molecule; and
   an ALD apparatus downstream of and in fluid communication with each of the first source, the second source, and the third source, the ALD apparatus comprising:
      a housing structure defining an internal chamber;
      a distribution assembly configured to receive and direct gaseous forms of each of the hydrazine-based compound, the Si-containing compound, and the N-containing molecule into the internal chamber; and
      a substrate holder within the internal chamber and configured to hold a base structure thereon.

16. The ALD system of claim 15, further comprising at least one vaporization device in fluid communication with the first source, the second source, and the ALD apparatus, the at least one vaporization device configured to receive one or more of a liquid form of the hydrazine-based compound and a liquid form of the Si-containing compound and to form one or more of a gaseous form of the hydrazine-based compound from the liquid form of the hydrazine-based compound and a gaseous form of the Si-containing compound from the liquid form of the Si-containing compound.

17. The ALD system of claim 15, further comprising at least one radical-generation device in fluid communication with the second source, the third source, and the ALD apparatus, the at least one radical-generation device configured to receive one or more of the Si-containing compound and the N-containing molecule and to form a one or more of a Si-centered radical from the Si-containing compound and an N-centered radical from the N-containing molecule.

18. The ALD system of claim 15, wherein the ALD apparatus comprises a spatial ALD apparatus, the spatial ALD apparatus further comprising dividers within the internal chamber and partitioning the internal chamber into multiple treatment regions comprising:
   a first treatment region configured to receive a gaseous form of the hydrazine-based compound from a first port of the distribution assembly;
   a second treatment region neighboring the first treatment region and configured to receive a gaseous form of one or more of the Si-containing compound and a Si-centered radical from a second port of the distribution assembly; and a third treatment region neighboring the second treatment region and configured to receive a gaseous form of one or more of the N-containing molecule and a N-centered radical from a third port of the distribution assembly.

19. The ALD system of claim 18, wherein the multiple treatment regions further comprises a fourth treatment region neighboring the third treatment region and configured to receive or generate plasma therein.

20. The ALD system of claim 18, wherein:
the distribution assembly is configured to simultaneously receive the hydrazine-based compound, the one or more of the Si-containing compound and a Si-centered radical, and the one or more of the N-containing molecule and an N-centered radical;
the distribution assembly is configured to simultaneously direct the hydrazine-based compound into the first treatment region through the first port, the one or more of the Si-containing compound and a Si-centered radical into the second treatment region through the second port, and the one or more of the N-containing molecule and a N-centered radical into the third treatment region through the third port; and
the substrate holder is configured to rotate through the first treatment region, the second treatment region, and the third treatment region.

21. The ALD system of claim 18, further comprising at least one signal generator electrically connected to the spatial ALD apparatus and configured to generate plasma within at least the third treatment region to form the N-centered radical from the N-containing molecule.

22. The ALD system of claim 15, wherein the ALD apparatus comprises a time-divided ALD apparatus configured to direct the gaseous forms of two or more of the hydrazine-based compound, Si-containing compound, and the N-containing molecule into the internal chamber at different times than one another.

23. The ALD system of claim 22, further comprising at least one signal generator electrically connected to the time-divided ALD apparatus and configured to generate plasma within the internal chamber.

24. A method of forming a seal material through atomic layer deposition (ALD), comprising:
directing a first gaseous stream comprising a hydrazine-based compound including Si—N—Si bonds into an internal chamber of an ALD apparatus to chemisorb the hydrazine-based compound to a base structure held within the internal chamber;
directing a second gaseous stream comprising one or more of a Si-containing compound and a Si-centered radical into the internal chamber to react with the chemisorbed hydrazine-based compound and form an intermediate material; and
directing a third gaseous stream comprising one or more of an N-containing compound and an N-centered radical into the internal chamber to react with the intermediate material and form at least a portion of the seal material.

25. The method of claim 24, wherein the ALD apparatus comprises a spatial ALD apparatus.

26. The method of claim 24, wherein the ALD apparatus comprises a time-divided ALD apparatus.

27. The method of claim 24, further comprising directing a fourth gaseous stream comprising one or more of $N_2$ gas and an N-containing plasma into the internal chamber to interact with the at least a portion of the seal material.

* * * * *

UNITED STATES PATENT AND TRADEMARK OFFICE
CERTIFICATE OF CORRECTION

PATENT NO. : 11,551,926 B2
APPLICATION NO. : 17/248376
DATED : January 10, 2023
INVENTOR(S) : Farrell M. Good and Robert K. Grubbs It is certified that error appears in the above-identified patent and that said Letters Patent is hereby corrected as shown below:

In the Specification

| | | |
|---|---|---|
| Column 4, | Line 34, | change "proximate e.g.," to --proximate (e.g.,-- |
| Column 8, | Line 16, | change "silane ($C_8H_{22}N_2Si$)," to --silane ($C_8H_{22}N_2Si$)),-- |
| Column 11, | Line 58, | change "hexahalide e.g.," to --hexahalide (e.g.,-- |
| Column 18, | Line 21, | change "direction Di" to --direction $D_1$-- |
| Column 18, | Line 34, | change "direction Di" to --direction $D_1$-- |
| Column 18, | Line 39, | change "direction Di" to --direction $D_1$-- |
| Column 18, | Line 44, | change "direction Di" to --direction $D_1$-- |
| Column 20, | Line 46, | change "(ti/Ti, wherein ti is the pulse width and Ti" to --($t_1/T_1$, wherein $t_1$ is the pulse width and $T_1$-- |
| Column 28, | Lines 60-61, | change "(ti/Ti, wherein ti is the pulse width and Ti" to --($t_1/T_1$, wherein $t_1$ is the pulse width and $T_1$-- |

Signed and Sealed this
Fifth Day of December, 2023

Katherine Kelly Vidal
*Director of the United States Patent and Trademark Office*